(12) United States Patent
Kim et al.

(10) Patent No.: US 12,591,043 B2
(45) Date of Patent: Mar. 31, 2026

(54) ELECTRONIC DEVICE WITH OPTICAL SENSOR

(71) Applicant: SAMSUNG ELECTRONICS CO., LTD., Suwon-si (KR)

(72) Inventors: Jongah Kim, Suwon-si (KR); Heewoong Yoon, Suwon-si (KR); Kihyuk Lee, Suwon-si (KR); Donghan Lee, Suwon-si (KR); Jeongho Cho, Suwon-si (KR); Gwangho Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 966 days.

(21) Appl. No.: 17/836,619

(22) Filed: Jun. 9, 2022

(65) Prior Publication Data

US 2022/0334224 A1     Oct. 20, 2022

Related U.S. Application Data

(63) Continuation of application No. PCT/KR2022/095060, filed on Mar. 22, 2022.

(30) Foreign Application Priority Data

Apr. 7, 2021     (KR) ........................ 10-2021-0045240

(51) Int. Cl.
*G01S 7/481*     (2006.01)
*G01C 3/08*     (2006.01)
(Continued)

(52) U.S. Cl.
CPC .............. *G01S 7/4813* (2013.01); *G01C 3/08* (2013.01); *G06F 1/1652* (2013.01); *G09G 3/035* (2020.08);
(Continued)

(58) Field of Classification Search
CPC .. H04M 1/0268; H04M 1/0274; H04M 1/026; G06F 1/1652; G06F 1/1658; G09F 9/301; G01S 7/4813
See application file for complete search history.

(56) References Cited

U.S. PATENT DOCUMENTS 10,373,591 B2     8/2019  Cho et al.
10,418,352 B1 *   9/2019  Chien ................... H01L 25/165
(Continued)

FOREIGN PATENT DOCUMENTS

KR     10-2005-0103553 A     11/2005
KR     10-2017-0011355 A     2/2017
(Continued)

OTHER PUBLICATIONS

International Search Report dated Jun. 24, 2022, issued by the International Searching Authority in International Application No. PCT/KR2022/095060 (PCT/ISA/210).

*Primary Examiner* — Yuqing Xiao
*Assistant Examiner* — Andrea Maria Baca
(74) *Attorney, Agent, or Firm* — Sughrue Mion, PLLC

(57)     ABSTRACT

An electronic device including an optical sensor is disclosed. An electronic device may include: a first housing; a second housing connected to the first housing to be partially movable in a movement direction; a flexible display that is disposed to be supported by the first housing and the second housing, in which a size of a display area exposed to the outside changes according to a movement of the second housing with respect to the first housing, and in which a light transmitter through which light is transmitted is formed; a printed circuit board (PCB) disposed in an internal space formed by the first housing and the second housing; an optical sensor configured to sense a target located outside the flexible display; and a processor. The optical sensor may include: a light source disposed on the PCB and configured
(Continued)

to irradiate light to the outside of the flexible display through the light transmitter; and a light receiver connected to a rear surface of the display area of the flexible display and configured to receive light reflected from the target through the light transmitter. Relative positions of the light source and the light receiver may change according to a change in the size of the display area. In addition, various example embodiments may be possible.

20 Claims, 15 Drawing Sheets

(51) Int. Cl.
    *G06F 1/16*         (2006.01)
    *G09G 3/00*         (2006.01)
    *H04M 1/02*         (2006.01)
    *G01B 11/26*       (2006.01)
    *H05K 5/00*        (2025.01)
(52) U.S. Cl.
    CPC ........... *H04M 1/0268* (2013.01); *G01B 11/26* (2013.01); *G09G 2330/02* (2013.01); *G09G 2360/14* (2013.01); *H05K 5/0017* (2013.01)

(56) References Cited

U.S. PATENT DOCUMENTS

| | | | |
|---|---|---|---|
| 10,739,908 B2 | 8/2020 | Franklin et al. | |
| 10,788,862 B2 | 9/2020 | Xia et al. | |
| 10,853,618 B2 | 12/2020 | Ko et al. | |
| 10,904,371 B1 * | 1/2021 | Song | G06F 1/1656 |
| 2011/0105203 A1 | 5/2011 | Nakagawa et al. | |
| 2017/0140737 A1 | 5/2017 | Cho et al. | |
| 2019/0278422 A1 | 9/2019 | Franklin et al. | |
| 2019/0286194 A1 | 9/2019 | Xia et al. | |
| 2019/0303641 A1 | 10/2019 | Ko et al. | |
| 2019/0305237 A1 | 10/2019 | Shin et al. | |
| 2020/0241138 A1 * | 7/2020 | Allen | G01S 7/481 |
| 2020/0304613 A1 | 9/2020 | Cha et al. | |

FOREIGN PATENT DOCUMENTS

| | | | |
|---|---|---|---|
| KR | 10-2018-0017481 A | 2/2018 |
| KR | 10-2019-0113128 A | 10/2019 |
| KR | 10-2020-0019406 A | 2/2020 |
| KR | 10-2020-0036684 A | 4/2020 |
| KR | 10-2020-0111083 A | 9/2020 |

* cited by examiner

ELECTRONIC DEVICE WITH OPTICAL SENSOR

CROSS-REFERENCE TO RELATED APPLICATIONS

This application is a Continuation application of International Application No. PCT/KR2021/095060, filed on Mar. 22, 2022, in the Korean Intellectual Property Receiving Office and claiming priority to Korean Patent Application No. 10-2021-0045240, filed on Apr. 7, 2021, in the Korean Intellectual Property Office, the disclosures of which are incorporated by reference herein in their entireties.

BACKGROUND

1. Field

The disclosure relates to an electronic device including an optical sensor.

2. Description of Related Art

There is a demand for technology to increase the usage time of electronic devices by preventing unnecessary power consumption. For example, an electronic device may include various sensors to recognize whether a target such as a user is close to the electronic device. An optical sensor as a type of sensors is being used to irradiate light to the target and determine information regarding the target based on light reflected from the target.

SUMMARY

An electronic device in which an area of a display exposed to the outside changes according to a state in which the electronic device is used has been developed. An optical sensor that recognizes external information of an electronic device using light may include a light source that emits light, and a light receiver that receives reflected light. To apply the optical sensor to the electronic device, there is a need to isolate the light source and the light receiver such that the light emitted by the light source is not directly irradiated to the light receiver. In particular, in the electronic device in which the area of the display changes, there is a need for a technology of preventing a malfunction (e.g., crosstalk) due to noise by effectively separating the light source and the light receiver instead of interfering with a change in the display.

According to various example embodiments, an isolation structure of a light source and a light receiver may be secured without a separate isolation structure, through an arrangement structure in which the light source is installed in a housing and the light receiver is installed on a display.

According to various example embodiments, uniform optical performance may be secured through a relative arrangement structure of a light source and a light receiver even though a state of a display changes according to an operation of an electronic device.

The technical goals to be achieved through example embodiments of the present disclosure are not limited to those described above, and other technical goals not mentioned above are clearly understood by one of ordinary skill in the art from the following description.

According to various example embodiment, disclosed is an electronic device including: a first housing; a second housing connected to the first housing, one of the first housing and the second housing being movable in a movement direction with respect to another of the first housing and the second housing; a flexible display that is supported by the first housing and the second housing, the flexible display having a light transmitting portion through which light is transmitted and a display area, a size of the display area exposed to an outside changing based on a movement of the second housing with respect to the first housing; a printed circuit board (PCB) disposed in an internal space formed at least by the first housing and the second housing; an optical sensor configured to sense a target located outside the electronic device; and a processor, wherein the optical sensor includes: a light source disposed on the PCB and configured to irradiate light toward outside of the electronic device through the light transmitting portion; and a light receiver disposed at a rear surface of the display area of the flexible display and configured to receive light reflected from the target, through the light transmitting portion, wherein relative positions of the light source and the light receiver change based on a change in the size of the display area.

According to various example embodiment, disclosed is an electronic device including: a first housing; a second housing movably connected to the first housing; a flexible display including a display area and, based on a movement of the second housing with respect to the first housing, operable to be in a first state or a second state, the display area exposed to an outside having a minimum area in the first state and the display area having a maximum area in the second state; a printed circuit board (PCB) disposed in an internal space formed by at least the first housing and the second housing; an optical sensor including: a light source disposed on the PCB and configured to irradiate light to an outside of the electronic device through the flexible display; and a light receiver disposed at a rear surface of the flexible display and configured to receive reflected light from the outside through the flexible display; and a processor, wherein the light receiver moves relative to the light source based on a change in a state of the display area, and wherein a distance between the light receiver and a reference line that is perpendicular to a movement direction of the light receiver and on which the light source is located changes in proportion to a change in the size of the display area.

According to various example embodiment, disclosed is an electronic device including: a first housing; a second housing movably connected to the first housing; a flexible display including a display area and, based on a movement of one of the first housing and the second housing with respect to another of the first housing and the second housing, operable to be a first state or a second state, the display area exposed to an outside having a minimum area in the first state and the display area having a maximum area in the second state; a printed circuit board (PCB) disposed in an internal space formed by at least the first housing and the second housing; an optical sensor including: a light source disposed on the PCB and configured to irradiate light to an outside of the electronic device through the flexible display; and a light receiver disposed at a rear surface of the flexible display and configured to receive reflected light from the outside through the flexible display; and a processor, wherein the light receiver moves relative to the light source in a movement direction based on a change in a state of the display area, and wherein a distance between the light receiver and the light source in the first state and a distance between the light receiver and the light source in the second state are substantially the same.

According to various example embodiments, based on a separation structure in which a light source is disposed in a housing and a light receiver is disposed on a rear surface of a display, a malfunction of an optical sensor may be minimized without a separate isolation structure.

According to various example embodiments, based on a relative arrangement structure of a light source and a light receiver in consideration of a change in an area of a display, it is possible to secure constant optical performance of an optical sensor regardless of a state of the display.

BRIEF DESCRIPTION OF THE DRAWINGS

The above and other aspects, features, and aspects of certain embodiments of the present disclosure will be more apparent from the following detailed description, taken in conjunction with the accompanying drawings, in which.

Figure 12:
Figure 12:
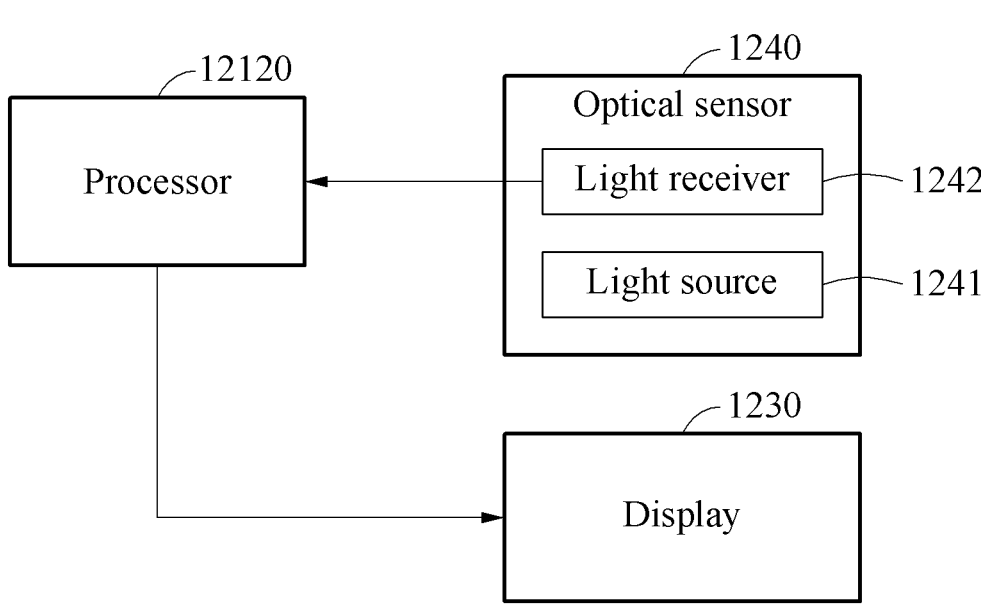

4 ing the front surface of the electronic device in a second state according to various example embodiments; and FIG. 12 is a block diagram of an electronic device according to various example embodiments.

DETAILED DESCRIPTION

Hereinafter, example embodiments will be described in detail with reference to the accompanying drawings. When describing the example embodiments with reference to the accompanying drawings, like reference numerals refer to like elements and a repeated description related thereto will be omitted.

Figure 1:
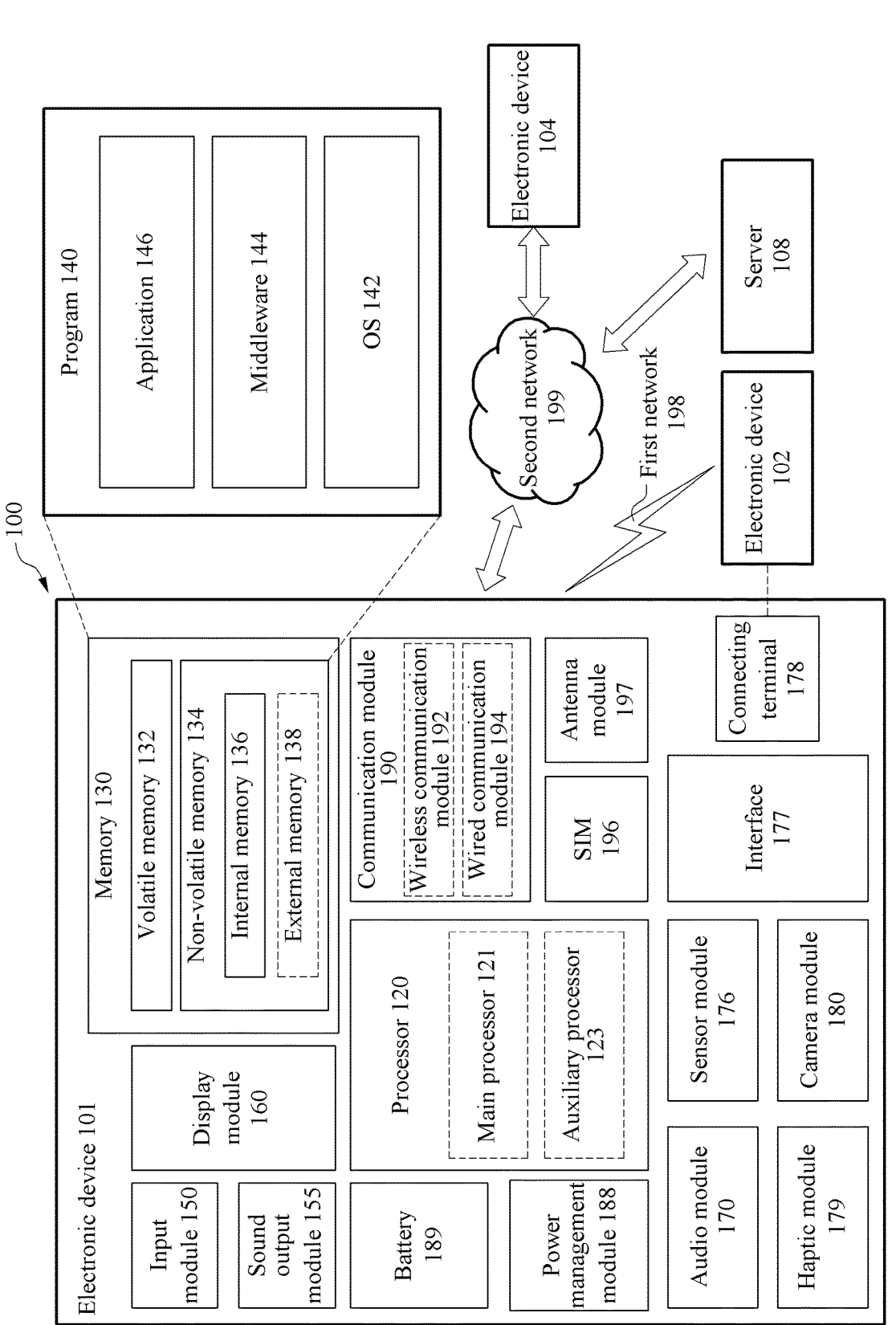
FIG. 1 is a block diagram illustrating an electronic device in a network environment according to various example embodiments.

FIG. 1 is a block diagram illustrating an electronic device 101 in a network environment 100 according to various example embodiments. Referring to FIG. 1, an electronic device 101 in the network environment 100 may communicate with an electronic device 102 via a first network 198 (e.g., a short-range wireless communication network), or communicate with an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In some example embodiments, at least one (e.g., the connecting terminal 178) of the above components may be omitted from the electronic device 101, or one or more other components may be added in the electronic device 101. In some example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a part of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an example embodiment, the auxiliary processor 123 (e.g., an image signal processor (ISP) or a communication processor (CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An artificial intelligence model may be generated by machine learning. Such learning may be performed by, for example, the electronic device 101 in which artificial intelligence is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may additionally or alternatively include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an example embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an example embodiment, the display device

160 may include a touch sensor adapted to sense a touch, or a pressure sensor adapted to measure an intensity of a force incurred by the touch.

The audio module 170 may convert a sound into an electric signal or vice versa. According to an example embodiment, the audio module 170 may obtain the sound via the input module 150 or output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a part of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local region network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide region network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and a next-generation communication technology, e.g., a new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to various example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 or 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
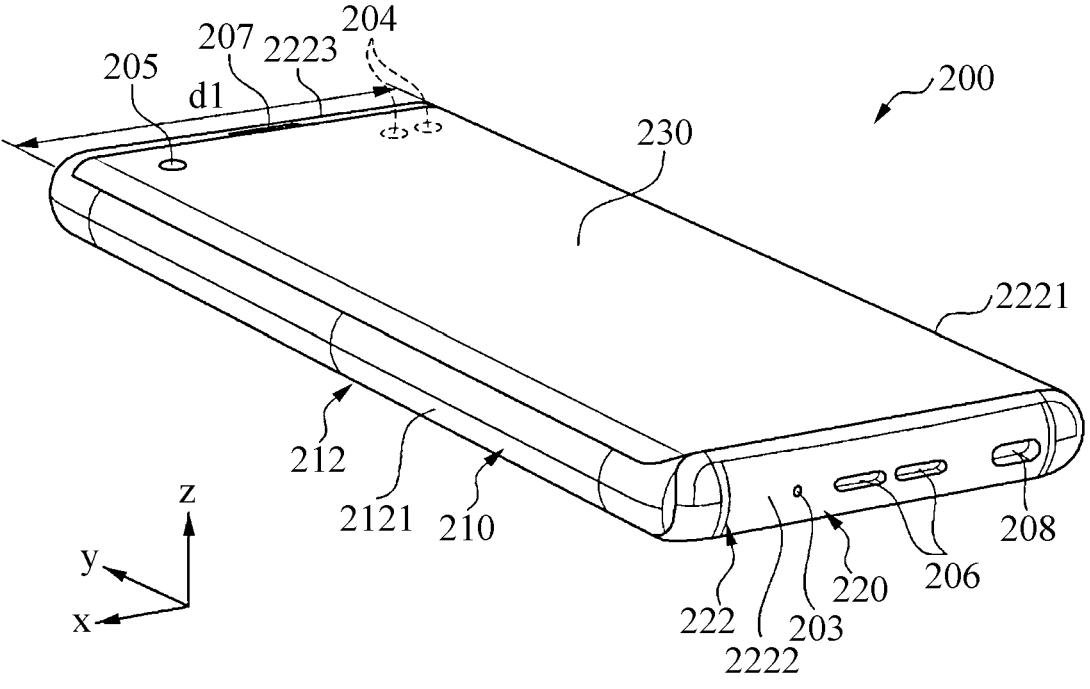
FIG. 2A is a perspective view illustrating a front surface of an electronic device in a closed state according to various example embodiments.
Figure 2B:
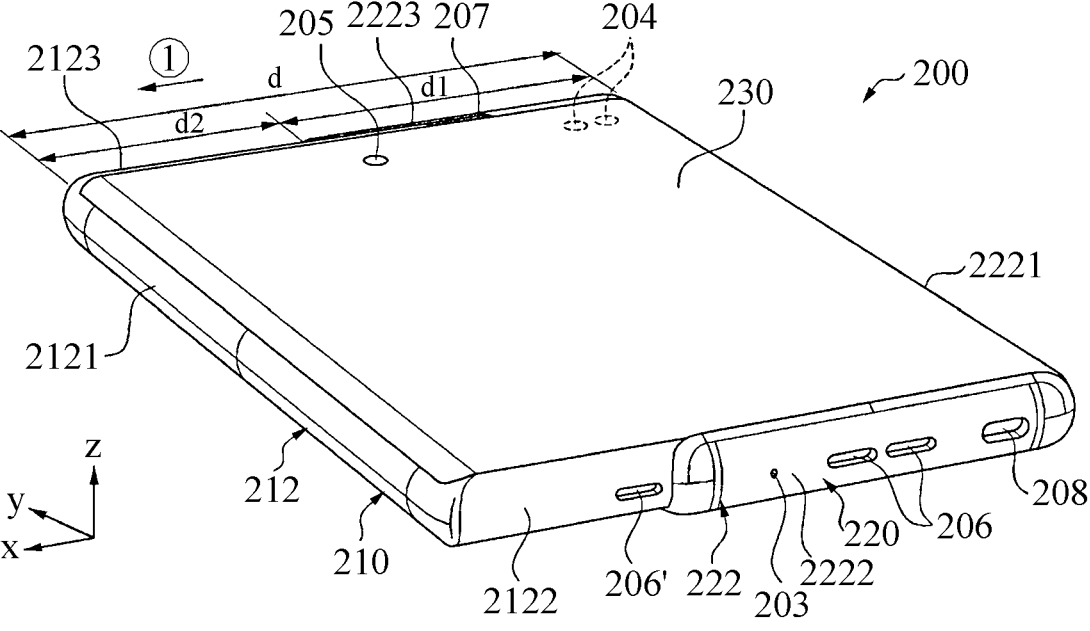
FIG. 2B is a perspective view illustrating the front surface of the electronic device in an open state according to various example embodiments.
Figure 3A:
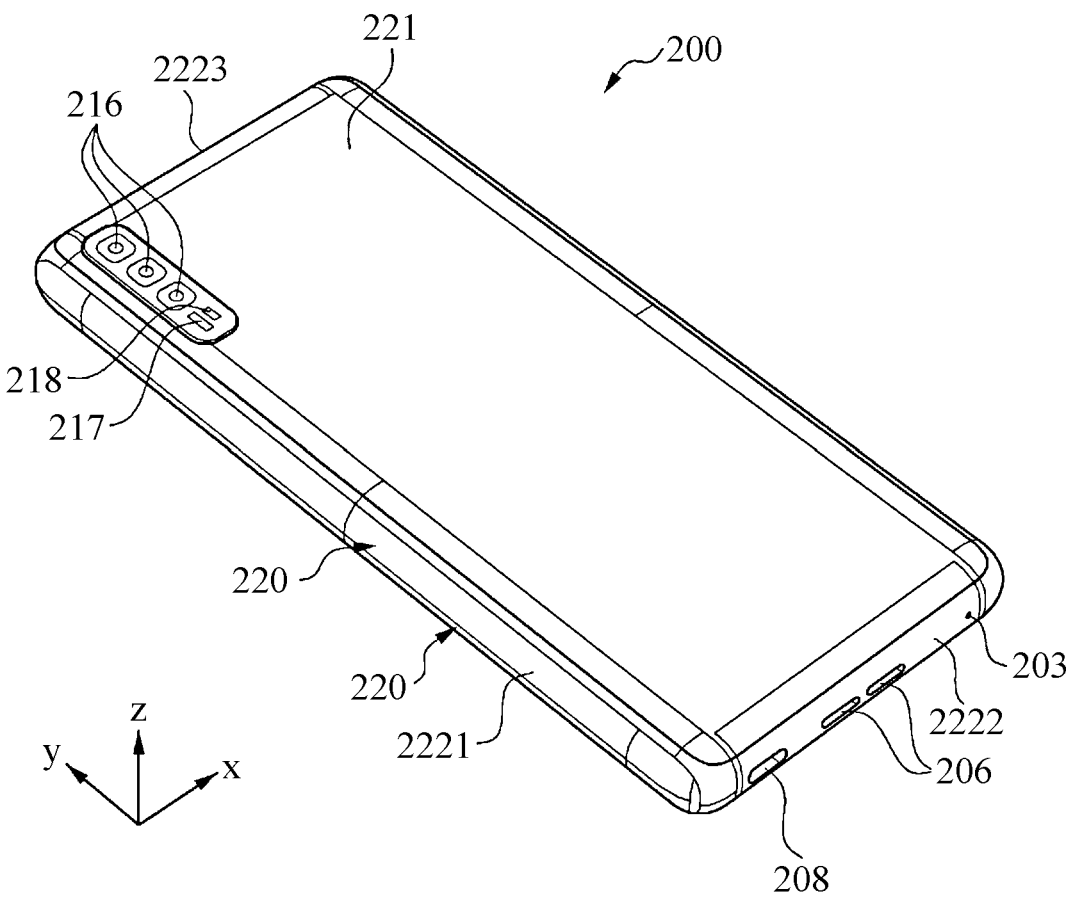
FIG. 3A is a perspective view illustrating a rear surface of an electronic device in a closed state according to various example embodiments.
Figure 3B:
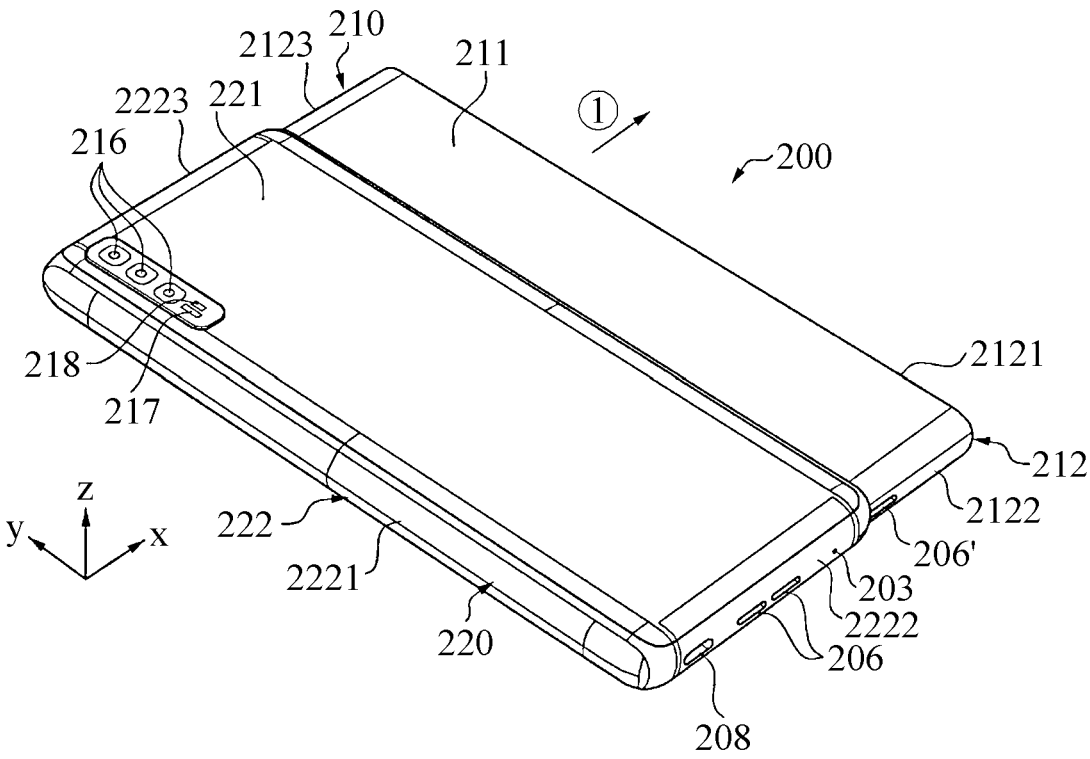
FIG. 3B is a perspective view illustrating the rear surface of the electronic device in an open state according to various example embodiments.

FIG. 2A is a perspective view illustrating a front surface of an electronic device in a closed state and FIG. 2B is a perspective view illustrating the front surface of the electronic device in an open state, according to various example embodiments. FIG. 3A is a perspective view illustrating a rear surface of an electronic device in a closed state and FIG. 3B is a perspective view illustrating the rear surface of the electronic device in an open state, according to various example embodiments.

An electronic device 200 of FIG. 2A may be at least partially similar to the electronic device 101 of FIG. 1, or may further include other components of the electronic device.

Referring to FIGS. 2A to 3B, the electronic device 200 may include a first housing 210, and a second housing 220 that is at least partially and movably coupled to the first housing 210. In another example embodiment, the first housing 210 is movably coupled to the second housing 220. Following descriptions relate to moving the second housing 220, but the descriptions equally relate to the example embodiment where the first housing 210 is moved. According to an example embodiment, the first housing 210 may include a first plate 211, and a first side frame 212 that extends in a substantially vertical direction (e.g., a z-axis direction) along an edge of the first plate 211. According to an example embodiment, the first side frame 212 may include a first side surface 2121, a second side surface 2122 extending from one end of the first side surface 2121, and a third side surface 2123 extending from the other end of the first side surface 2121. According to an example embodiment, the first housing 210 may include a first space that is at least partially closed from the outside through the first plate 211 and the first side frame 212.

According to various example embodiments, the second housing 220 may include a second plate 221, and a second side frame 222 that extends in a substantially vertical direction (e.g., the z-axis direction) along an edge of the second plate 221. According to an example embodiment, the second side frame 222 may include a fourth side surface 2221 facing away from the first side surface 2121, a fifth side surface 2222 extending from one end of the fourth side surface 2221 and at least partially coupled to the second side surface 2122, and a sixth side surface 2223 extending from the other end of the fourth side surface 2221 and at least partially coupled to the third side surface 2123. In an example, the fourth side surface 2221 may extend from a structure other than the second plate 221 and may also be coupled to the second plate 221. According to an example embodiment, the second housing 220 may include a second space that is at least partially closed from the outside by the second plate 221 and the second side frame 222. According to an example embodiment, the first plate 211 and the second plate 221 may be disposed to at least partially form a rear surface of the electronic device 200. For example, the first plate 211, the second plate 221, the first side frame 212, and the second side frame 222 may be formed of, for example, a polymer, coated or colored glass, ceramic, metal (e.g., aluminum, stainless steel (STS), or magnesium), or a combination of two or more of the above materials.

According to various example embodiments, the electronic device 200 may include a flexible display 230 disposed to be supported by the first housing 210 and the second housing 220. According to an example embodiment, the flexible display 230 may include a flat portion supported by the second housing 220, and a bendable portion extending from the flat portion and supported by the first housing 210. According to an example embodiment, the bendable portion of the flexible display 230 may be disposed in the first space of the first housing 210 not to be exposed to the outside when the electronic device 200 is closed, and may extend from the flat portion to be exposed to the outside while being supported by the first housing 210 when the electronic device 200 is open. Accordingly, the electronic device 200 may be a rollable electronic device in which a viewable display area of the flexible display 230, i.e., viewable display screen of the flexible display 230, is expanded in response to an open operation according to a movement of the first housing 210 from the second housing 220.

According to various example embodiments, in the electronic device 200, the first housing 210 may be at least partially inserted into the second space of the second housing 220, and may be coupled to be movable in direction ①. For example, in the closed state, the electronic device 200 may be maintained in a state in which the first housing 210 and the second housing 220 are coupled such that a distance between the first side surface 2121 and the fourth side surface 2221 is a first distance d1. According to an example embodiment, in the open state, the electronic device 200 may be maintained in a state in which the first housing 210 protrudes out, extends out or slides out from the second housing 220 such that a distance between the first side surface 2121 and the fourth side surface 2221 is a second distance d2. According to an example embodiment, the flexible display 230 may be supported by the first housing 210 and/or the second housing 220 such that both ends thereof have curved edges, in the open state.

According to various example embodiments, the electronic device 200 may automatically transition between the open state and the closed state by a driving unit disposed in the first space and/or the second space. For example, a processor (e.g., the processor 120 of FIG. 1) of the electronic device 200 may be configured to control an operation of the first housing 210 using the driving unit when an event for a transition between the open state and the closed state of the electronic device 200 is detected. In another example, the first housing 210 may be manually extended out from the second housing 220 through a user's manipulation. In this example, the first housing 210 may extend out by an amount desired by a user, and accordingly a screen of the flexible display 230 may have display areas of variable size. Accordingly, the processor (e.g., the processor 120 of FIG. 1) of the electronic device 200 may also perform control such that an object may be displayed in various ways and that an application program may be executed based on the size of a display corresponding to or based on an amount by which the first housing 210 extends out.

According to various example embodiments, the electronic device 200 may include at least one of an input device 203, sound output devices 206 and 207, sensor modules 204 and 217, camera devices 205 and 216, a connector port 208, a key input device (not illustrated), or an indicator (not illustrated). In another example embodiment, at least one of the above-described components of the electronic device 200 may be omitted, or the electronic device 200 may further include other components.

According to various example embodiments, the input device 203 may include a microphone 203. In some example embodiments, the input device 203 may include a plurality of microphones 203 arranged to sense a direction of sound. The sound output device 206 and 207 may include speakers 206 and 207. The speakers 206 and 207 may include an external speaker 206 and a phone call receiver 207. In an example embodiment, when an external speaker 206' is disposed in the first housing 210, sound may be output through a speaker hole 206 formed in the second housing 220 in the closed state. According to an example embodiment, the microphone 203 or the connector port 208 may also be formed to have substantially the same configuration. In an example embodiment, the sound output devices 206 and 207 may include a speaker (e.g., a piezo speaker) that operates without a separate speaker hole.

According to various example embodiments, the sensor modules 204 and 217 may generate an electrical signal or a data value corresponding to an internal operating state of the electronic device 200 or an external environmental state. The sensor modules 204 and 217 may include, for example, a first sensor module 204 (e.g., a proximity sensor or an illuminance sensor) disposed on a front surface of the second housing 220, and/or a second sensor module 217 (e.g., a heart rate monitoring (HRM) sensor) disposed on a rear surface of the second housing 220. According to an example embodiment, the first sensor module 204 may be disposed below the flexible display 230 in the second housing 220. According to an example embodiment, the first sensor module 204 may further include at least one of a proximity sensor, an illuminance sensor, a time of flight (ToF) sensor, an ultrasonic sensor, a fingerprint recognition sensor, a gesture sensor, a gyro sensor, an atmospheric pressure sensor, a magnetic sensor, an acceleration sensor, a grip sensor, a color sensor, an infrared (IR) sensor, a biometric sensor, a temperature sensor, or a humidity sensor.

According to various example embodiments, the camera devices 205 and 216 may include a first camera device 205 disposed on the front surface of the second housing 220 of the electronic device 200, and a second camera 216 disposed on the rear surface of the second housing 220. According to an example embodiment, the electronic device 200 may include a flash 218 located near the second camera device 216. According to an example embodiment, the camera devices 205 and 216 may include one or more lenses, an image sensor, and/or an ISP. According to an example embodiment, the first camera device 205 may be disposed under the flexible display 230, and may be configured to capture an object through a portion of an active area of the flexible display 230. According to an example embodiment, the flash 218 may include, for example, a light-emitting diode (LED) or a xenon lamp. In some example embodiments, two or more lenses (e.g., a wide-angle lens and a telephoto lens) and image sensors may be disposed on one surface of the electronic device 200.

According to various example embodiments, the electronic device 200 may include at least one antenna (not shown). According to an example embodiment, the at least one antenna may wirelessly communicate with an external electronic device (e.g., the electronic device 104 of FIG. 1), or may wirelessly transmit and receive power required for charging. According to an example embodiment, the antenna may include a legacy antenna, a mmWave antenna, a near field communication (NFC) antenna, a wireless charging antenna, and/or a magnetic secure transmission (MST) antenna. In an example embodiment, an antenna structure may be formed through at least a portion of the first side frame 212 and/or the second side frame 222, which are formed of metal.

For convenience of description, FIGS. 2A and 3B illustrate an example in which a display area of a flexible display 230 exposed to the outside of the electronic device 200 is expanded in a +x-axis direction (e.g., a left direction when the front of the electronic device is viewed in a portrait orientation), however, a direction in which the display area of the flexible display 230 exposed to the outside of the electronic device 200 is expanded is not limited thereto. In an example embodiment, the electronic device 200 may operate such that the display area of the flexible display 230 exposed to the outside may be expanded in a −x-axis direction (e.g., a right direction), a +y-axis direction (e.g., an upward direction), or a −y-axis direction (e.g., a downward direction). The display area of the flexible display 230 may be expanded in one direction or all directions even though the display area of the flexible display 230 is expanded in a horizontal direction (e.g., an ±x-axis direction) or a vertical direction (e.g., a ±y-axis direction). In an example, when the electronic device 200 operates such that the flexible display 230 exposed to the outside is expanded in the ±x-axis direction (e.g., the left or right direction), the flexible display 230 may be expanded in either one or both of the +x-axis direction (e.g., the left direction) or the −x-axis direction (e.g., the right direction). In another example, when the electronic device 101 operates such that the flexible display 230 is expanded in a vertical direction (e.g., the ±y-axis direction), the flexible display 230 may be expanded in either one or both of the upward direction (e.g., the +y-axis direction) and the downward direction (e.g., the −y-axis direction). Although various example embodiments will be described below under the assumption that the display area of the flexible display 230 is expanded in the −x direction for convenience of description, an implementation method of each example embodiment is not limited thereto.

Figure 4A:
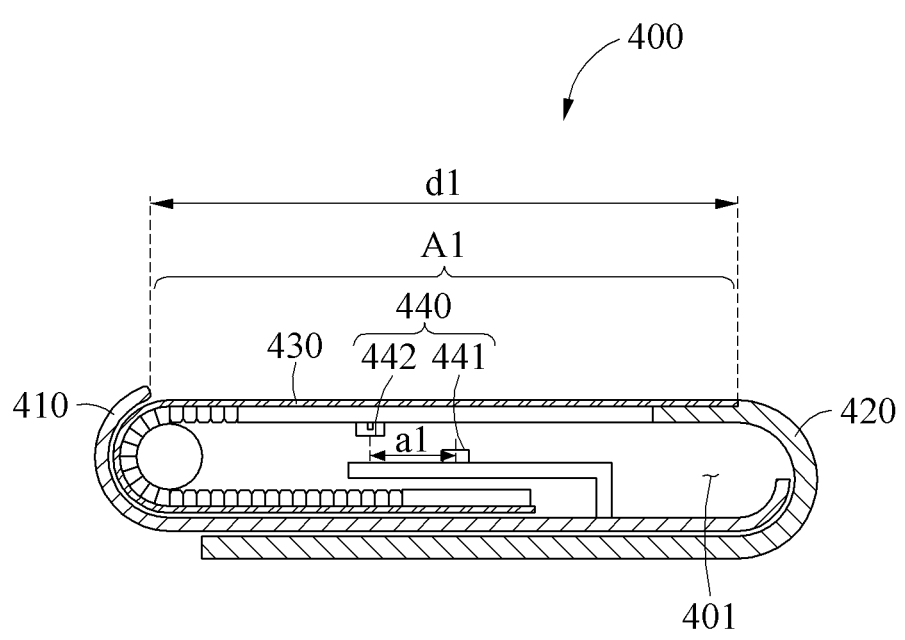
FIG. 4A is a cross-sectional view of an electronic device in a first state according to various example embodiments.
Figure 4B:
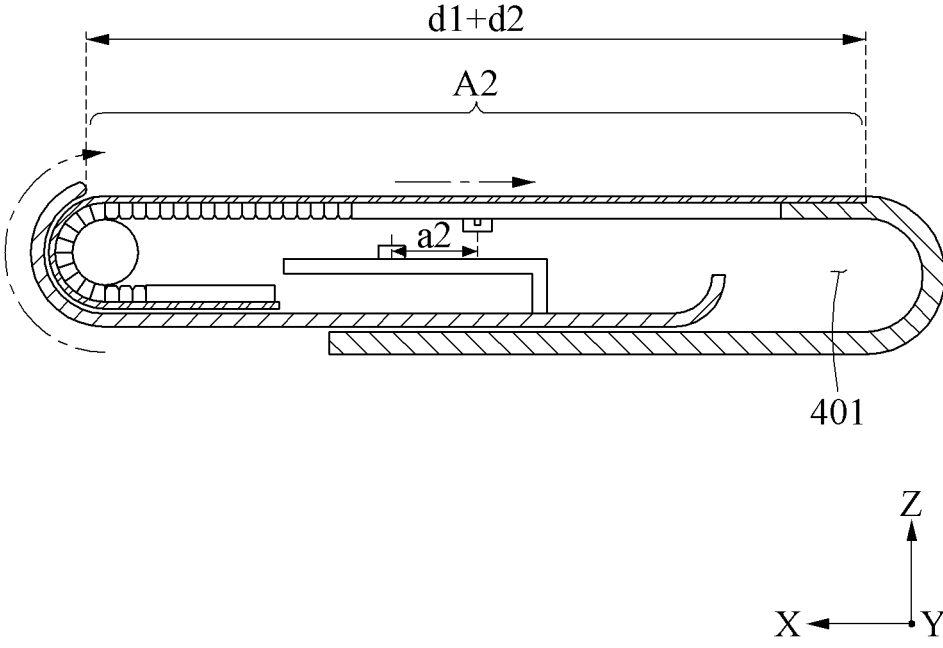
FIG. 4B is a cross-sectional view of the electronic device in a second state according to various example embodiments.

FIG. 4A is a cross-sectional view of an electronic device in a first state according to various example embodiments, and FIG. 4B is a cross-sectional view of the electronic device in a second state according to various example embodiments. Referring to FIGS. 4A and 4B, an electronic device 400 (e.g., the electronic device 101 of FIG. 1 or the electronic device 200 of FIG. 2A) according to various example embodiments may include a first housing 410 (e.g., the first housing 210 of FIG. 2A), a second housing 420 (e.g., the second housing 220 of FIG. 2A), a flexible display 430 (e.g., the flexible display 230 of FIG. 2A), an optical sensor 440 (e.g., the sensor module 204 of FIG. 2A), and a processor (e.g., the processor 120 of FIG. 1).

The first housing 410 and the second housing 420 may form an exterior of the electronic device 400. The first housing 410 and the second housing 420 may be partially and movably connected. For example, the second housing 420 may be connected to the first housing 410 and may be movable in a movement direction (e.g., an X-axis direction of FIG. 4A) with respect to the first housing 410. In an example embodiment, a size of an internal space 401 of the electronic device 400 at least formed by the first housing 410 and the second housing 420 may vary according to a relative movement of the first housing 410 and the second housing 420. The first housing 410 and the second housing 420 may move with respect to each other according to a user's manipulation such that a state may be changed between a first state (e.g., the closed state of FIG. 2A) in which the size of the internal space 401 is minimized as shown in FIG. 4A and a second state (e.g., the open state of FIG. 2B) in which the size of the internal space 401 is maximized as shown in FIG. 4B.

In an example embodiment, the flexible display 430 may be disposed to be supported by the first housing 410 and the second housing 420, and may be visually exposed to the outside, for example, a front surface (e.g., a top surface of FIG. 4A) of the first housing 410 and the second housing 420, of the electronic device 400 through a display area. In an example embodiment, a size of the display area of the flexible display 430 exposed to the outside may change according to the relative movement of the first housing 410 and the second housing 420. In the following description, for convenience of description, it may be assumed that the second housing 420 may move in the movement direction with respect to the first housing 410.

In an example embodiment, the flexible display 430 may include an unbreakable (UB) type organic light-emitting diode (OLED) display (e.g., a curved display) including a micro-LED, or an OLED. In an example embodiment, a touch panel (not shown) may be formed in at least a portion of the flexible display 430, and the flexible display 430 may include an on cell touch active matrix organic light-emitting diode (AMOLED) (OCTA) type display. The type of the flexible display 430 is not limited to the above-described example, and the flexible display 430 may be formed in various ways (e.g., an add-on type or an in-cell type).

In an example embodiment, the state of the flexible display 430 may be changed between the first state (e.g., the closed state of FIG. 2A) in which the display area has a minimum area A1 as shown in FIG. 4A and the second state (e.g., the open state of FIG. 2B) in which the display area has a maximum area A2, according to a movement operation of the second housing 420 with respect to the first housing 410. In this example, the display area of the flexible display 430 may decrease or increase according to the movement direction (e.g., the +X-axis direction of FIG. 4A). For example, when the second housing 420 moves a maximum distance of distance d2 with respect to the first housing 410 in the movement direction, the flexible display 430 may have a display width corresponding to d1 in the first state of FIG. 4A and have a display width corresponding to d1+d2 in the second state of FIG. 4B. In this example, the minimum area A1 of the display area in the first state and the maximum area A2 of the display area in the second state may be proportional to a display width of the display area parallel to the movement direction. Although the display area of the flexible display 430 is in the first state and the second state as shown in FIGS. 4A and 4B, intermediate states between the first state and the second state are possible so that the display area of the flexible display 430 has an area between the minimum area A1 of the first state and the maximum area A2 of the second state according to the operation of the electronic device 400.

Figure 6A:
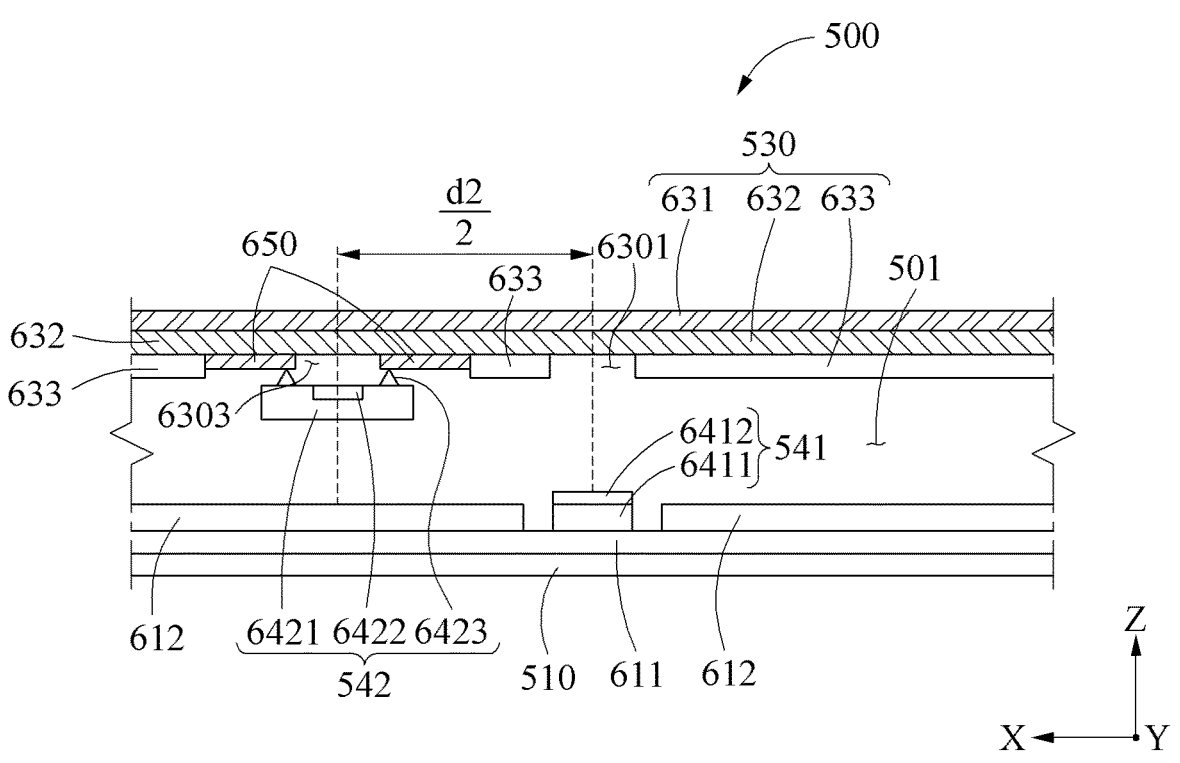
FIG. 6A is a cross-sectional view of the electronic device taken along line A-A of FIG. 5A.
Figure 6B:
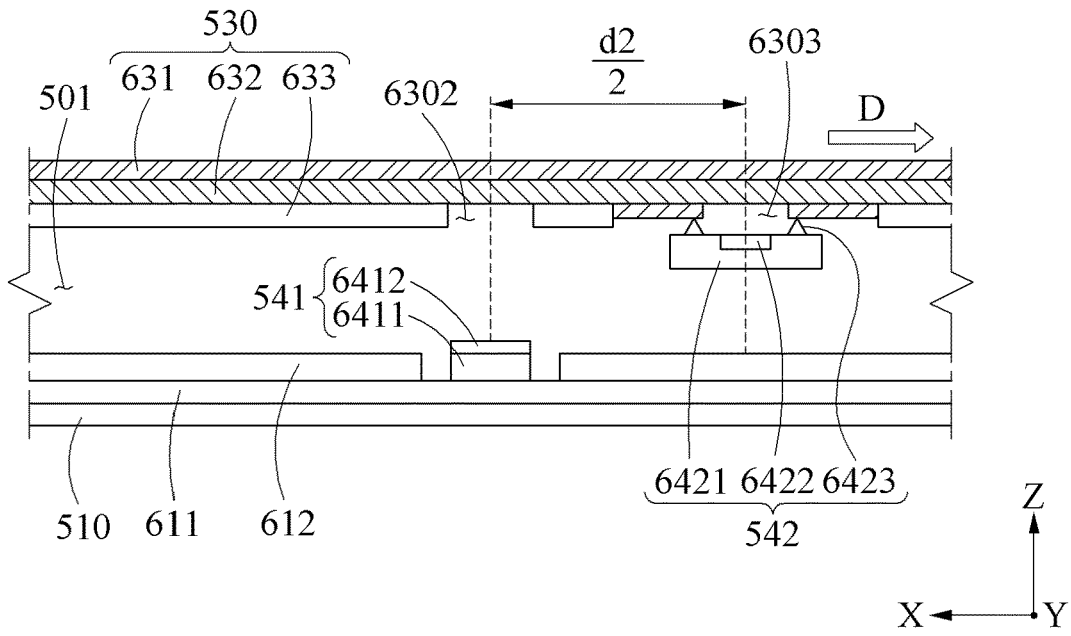
FIG. 6B is a cross-sectional view of the electronic device taken along line B-B of FIG. 5B.

In an example embodiment, in the flexible display 430, a light transmitting portion (e.g., a first sensor hole 6301, a second sensor hole 6302, or a third sensor hole 6303 of FIG. 6A or 6B) through which light is transmitted may be formed. The light transmitting portion may be formed by removing, for example, a layer (e.g., a cover panel 633 of FIG. 6A) that absorbs light, but may be formed in a form of a window that penetrates the flexible display 430. The light transmitting portion will be further described below.

In an example embodiment, the optical sensor 440 may sense a target (e.g., a user or an object) located outside the flexible display 430, that is, outside of the electronic device 400. The optical sensor 440 may include a light source 441 configured to irradiate light to the target, and a light receiver 442 configured to receive light reflected from the target. In an example embodiment, the light source 441 may be disposed in the internal space 401 and may irradiate light toward the outside of the flexible display 430 through the light transmitting portion. In an example embodiment, the light receiver 442 may be connected to a rear surface of the display area of the flexible display 430 and may receive light reflected from a target located outside of the electronic device 400 through the light transmitting portion. In this example, portions of the light receiver 442 outside its field of view (FoV) may be covered by a structure so that the light receiver 442 may receive light through the flexible display 430. In the above structure, the light irradiated by the light source 441 in the internal space 401 may be blocked from being directly irradiated to the light receiver 442, and accordingly the light generated by the light source 441 may be diffusely reflected in the internal space 401 to prevent the light from being directly irradiated to the light receiver 442, thereby preventing an occurrence of a phenomenon, for example, a crosstalk phenomenon, in which noise occurs.

In an example embodiment, a distance between the light source 441 and the light receiver 442 may change according to the relative movement of the first housing 410 and the second housing 420. For example, as shown in FIG. 4A, the light source 441 may be fixed to the first housing 410, and the light receiver 442 may be fixed to a rear surface of the flexible display 430. In this example, when the state of the flexible display 430 is changed from the first state of FIG. 4A to the second state of FIG. 4B, the distance between the light source 441 and the light receiver 442 may change from a1 to a2 in the movement direction.

In an example embodiment, a current applied to the light source 441 may be adjusted according to a change in the distance between the light source 441 and the light receiver 442. For example, the processor may adjust the current applied to the light source 441 in response to a change in the distance between the light source 441 and the light receiver 442 according to a change in the size of the display area of the flexible display 430, to secure predetermined performance of the optical sensor 440.

According to an example embodiment, the optical sensor 440 may include various types of sensors using an intensity of light. The optical sensor 440 may include, for example, a camera module, a spectrometer, a gesture sensor, an ultraviolet (UV) sensor, an RGB sensor, an illuminance sensor, or an IR sensor.

Figures 5A, 5B:
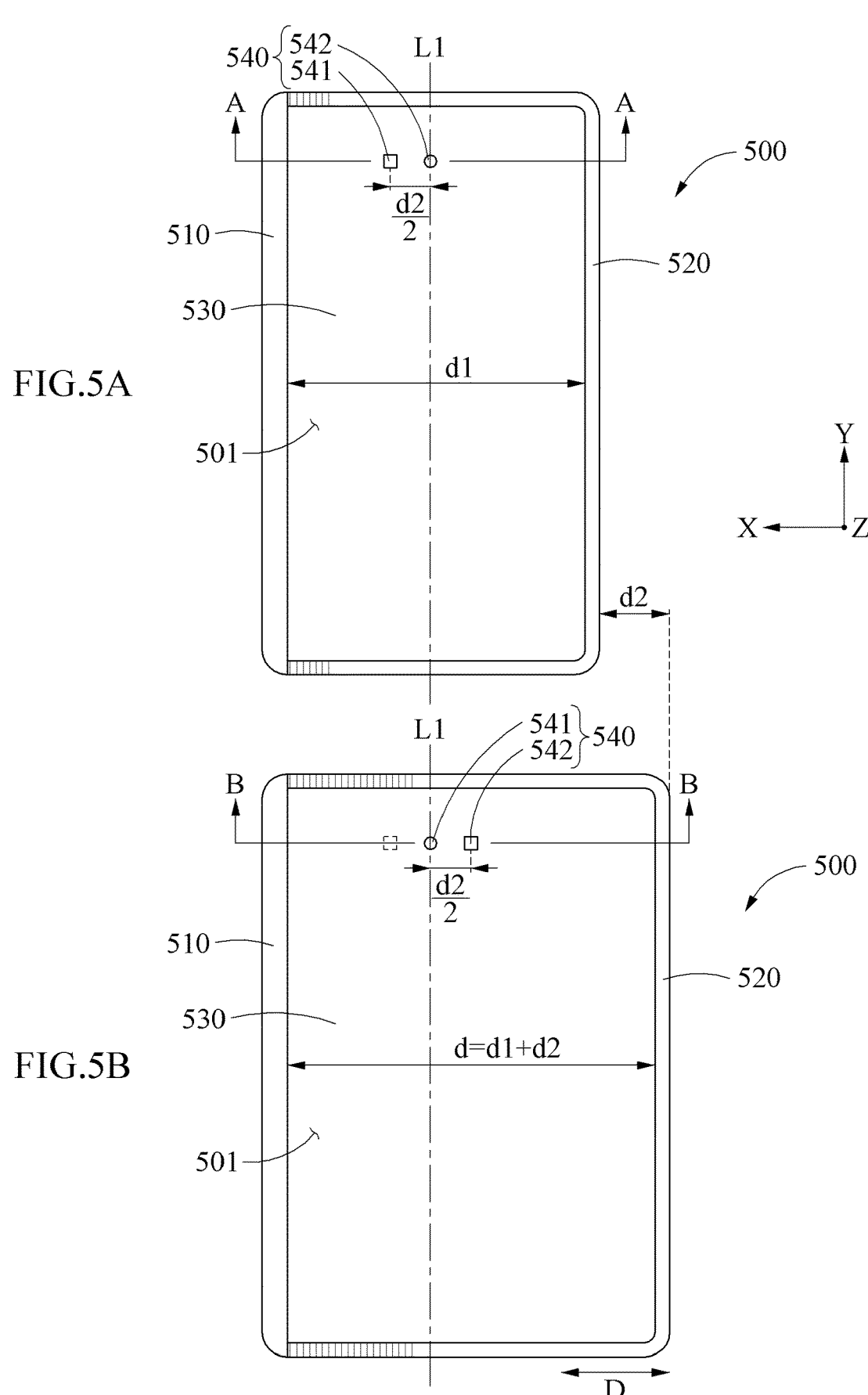
FIG. 5A is a diagram illustrating a front surface of an electronic device in a first state according to various example embodiments.
FIG. 5B is a diagram illustrating the front surface of the electronic device in a second state according to various example embodiments.

FIG. 5A is a diagram illustrating a front surface of an electronic device in a first state according to various example embodiments, and FIG. 5B is a diagram illustrating the front surface of the electronic device in a second state according to various example embodiments. FIG. 6A is a cross-sectional view of the electronic device taken along line A-A of FIG. 5A, and FIG. 6B is a cross-sectional view of the electronic device taken along line B-B of FIG. 5B.

Referring to FIGS. 5A, 5B, 6A, and 6B, an electronic device 500 (e.g., the electronic device 101 of FIG. 1, the electronic device 200 of FIG. 2A, or the electronic device 400 of FIG. 4A) according to an example embodiment may include a first housing 510 (e.g., the first housing 210 of FIG. 2A), a second housing 520 (e.g., the second housing 220 of FIG. 2A), a flexible display 530 (e.g., the flexible display 230 of FIG. 2A), a PCB 611 (e.g., a printed board assembly (PBA), a flexible PCB (FPCB) or a rigid-flexible PCB (RFPCB)), a display PCB 650, and an optical sensor 540 (e.g., the sensor module 204 of FIG. 2A).

In an example embodiment, the first housing 510 and the second housing 520 may be connected to be relatively movable in a movement direction D (e.g., an −X-axis direction of FIG. 5A). According to a relative movement of the second housing 520 with respect to the first housing 510, an operating state of the electronic device 500 may be changed between the first state of FIG. 5A and the second state of FIG. 5B.

The flexible display 530 may be supported by the first housing 510 and the second housing 520 and may be visually exposed partially or fully to the outside. In an example embodiment, a display area of the flexible display 530 may have a minimum area in the first state of FIG. 5A and a maximum area in the second state of FIG. 5B. The size of the display area of the flexible display 530 may vary depending on the first state and the second state according to the movement direction D.

In an example embodiment, the flexible display 530 may include a display panel 632, a protective film 631 (or a window) stacked on a front surface of the display panel 632, and the cover panel 633 attached to a rear surface of the display panel 632. In an example embodiment, the protective film 631, which is a thin film layer formed of a transparent material, may be formed in a form of a thin film to protect the display panel 632 from surroundings and to support a flexibility of the display panel 632. In an example embodiment, the protective film 631 may include a plastic film (e.g., a polyimide film) or thin glass (e.g., ultra-thin glass (UTG)).

In an example embodiment, the cover panel 633 may prevent the display panel 632 from being twisted or bent. In an example embodiment, the cover panel 633 may include a plurality of layers to implement each function. The plurality of layers included in the cover panel 633 may be stacked via an adhesive member (not shown). For example, the cover panel 633 may include an embo layer, a buffer layer, or a metal layer. In an example embodiment, the embo layer may block light incident from the outside. The embo layer may be black-coated to prevent components in the internal space 501 from being visually exposed to the outside through the display area of the flexible display 530. In an example embodiment, the buffer layer may absorb an impact applied to the flexible display 530 to prevent damage to the flexible display 530. For example, the buffer layer may include a sponge layer, or a cushion layer. In an example embodiment, the metal layer may prevent the flexible display 530 from being twisted or bent, and may perform a function of dispersing heat generated from components mounted in the internal space 501 of the electronic device 500 or the flexible display 530 itself over the entire area of the flexible display 530 to dissipate the heat. In an example embodiment, the metal layer may include a composite sheet and a copper sheet. The composite sheet may be, for example, a sheet obtained by processing several sheets with different properties, and may include at least one of polyimide and graphite. The composite sheet may also be formed as a single sheet formed of one material (e.g., polyimide, or graphite).

In an example embodiment, the flexible display 530 may include a light transmitting portion through which light may be transmitted through an opening in the cover panel 633. The light transmitting portion may be formed in each area corresponding to the optical sensor 540 (e.g., an area corresponding to a light source 541 and an area corresponding to a light receiver 542) when the display area is viewed as shown in FIGS. 5A and 5B. For example, the light transmitting portion may include the first sensor hole 6301 formed in an area corresponding to a position of the light source 541 in the first state, the second sensor hole 6302 formed in an area corresponding to a position of the light source 541 in the second state, and the third sensor hole 6303 formed in an area corresponding to a position of the light receiver 542. Light emitted from the light source 541 through each of the first and the second sensor holes 6301 and 6302 may be transmitted through the flexible display 530 and irradiated to the outside, and light reflected from a target located outside the flexible display 530 may be transmitted through the flexible display 530 via the third sensor hole 6303 and received by the light receiver 542.

In an example embodiment, each of the sensor holes 6301, 6302, and 6303 may be formed to have a size corresponding to a FoV of the optical sensor 540. In an example embodiment, when the cover panel 633 includes a plurality of layers, a plurality of openings formed by removing each of the plurality of layers may overlap one another to form one sensor hole. In this example, openings formed in each layer may have substantially the same size and shape, or may also have different sizes and shapes.

The PCB 611 may be disposed in the internal space 501 formed at least by the first housing 510 and the second housing 520. The PCB 611 may be disposed, for example, in the internal space 501 formed by the first housing 510. Various electronic components (e.g., a processor, a GPU, etc.) for operating the electronic device 500 may be disposed on the PCB 611.

The display PCB 650 may be electrically connected to the flexible display 530. The display PCB 650 may be connected to the rear surface of the display area of the flexible display 530. When the display area of the flexible display 530 is expanded or reduced, a relative position of the display PCB 650 with respect to the first housing 510 or the second housing 520 may change. For example, when the display area is expanded as the second housing 520 moves away from the first housing 510 in the movement direction D, as shown in FIG. 5B, the display PCB 650 may move away from the first housing 510 in the movement direction D.

The optical sensor 540 may include the light source 541 and the light receiver 542.

In an example embodiment, the light source 541 may be placed on the PCB 611. In an example embodiment, the light source 541 may include an interposer package 6411 connected to the PCB 611, and a light emitter 6412 configured to emit light. The light source 541 may be connected to the PCB 611 such that a light emission area of the light emitter 6412 may face the rear surface of the display area. A front 612 for fixing the PCB 611 to an electronic device 600 may be disposed near the interposer package 6411. In an example embodiment, when the PCB 611 is seated in the internal space 501 of the first housing 510, the position of the light source 541 may be relatively fixed with respect to the first housing 510.

In an example embodiment, the light receiver 542 may be connected to the display PCB 650. The light receiver 542 may include a light receiving package 6421, a photodiode 6422 configured to detect light, and a connection member 6423 configured to connect the light receiving package 6421 to the display PCB 650. The light receiver 542 may be connected to the display PCB 650 such that a FoV of the photodiode 6422 may face the flexible display 530. In this example, the light receiving package 6421 may cover at least a portion of the photodiode 6422 to block light generated by the light source 541 from being directly irradiated to the photodiode 6422 in the internal space 501.

In an example embodiment, a distance between the light source 541 and the light receiver 542 may change according to the state of the electronic device 500, when the display area is viewed as shown in FIGS. 5A and 5B. For example, when the display area is expanded in the movement direction D in response to a change in the operating state of the electronic device 500 from the first state to the second state as shown in FIGS. 5A and 5B, the light receiver 542 may move relative to the light source 541 in the movement direction D. In an example embodiment, when the display area is viewed as shown in FIGS. 5A and 5B, the first sensor hole 6301 may be located in an area of the flexible display 530 corresponding to the light source 541 in the first state, and the second sensor hole 6302 may be located in an area of the flexible display 530 corresponding to the light source 541 in the second state. In this example, the third sensor hole 6303 may be located in an area of the flexible display 530 in which the light receiver 542 is located.

In an example embodiment, the optical sensor 540 may have an arrangement structure of the light source 541 and the light receiver 542 designed to secure the same optical performance in the first state and the second state of the electronic device 500.

In an example embodiment, when the display area is viewed as shown in FIGS. 5A and 5B, the light receiver 542 may be disposed on the rear surface of the flexible display 530 such that a position of the light receiver 542 in the first state and a position of the light receiver 542 in the second state may be symmetrical (e.g., mirror symmetry) to each other with respect to a reference line L1 that is perpendicular to the movement direction D and on which the light source 541 is located. For example, the light receiver 542 may be disposed on a left side (e.g., an +X-axis direction of FIG. 5A) of the reference line L1 in the first state, as shown in FIG. 5A, and may be disposed on a right side (e.g., a −X-axis direction of FIG. 5A) of the reference line L1 in the second state, as shown in FIG. 5B. In this example, a distance between the light source 541 and the light receiver 542 in the first state, and a distance between the light source 541 and the light receiver 542 in the second state may be substantially the same, e.g., with a 10% difference. For example, it may be assumed that a width of the display area parallel to the movement direction D is increased by d2 when the display area is expanded in response to a change in the operating state of the electronic device 500 from the first state to the second state, the light receiver 542 may be disposed at a position spaced apart by a distance of $$\frac{d2}{2}$$

to the left side (e.g., the +X-axis of FIG. 5A) of the reference line L1 in the first state. After expanding the display area, the light receiver 542 may be disposed at a position where the reference line is spaced apart by a distance of $$\frac{d2}{2}$$

to the right (e.g., −X-axis of FIG. 5A) in the second state.

Based on the above structure, a distance between the light source 541 and the light receiver 542 in the first state and a distance between the light source 541 and the light receiver 542 in the second state may be substantially the same, and thus predetermined optical performance, for example, the same recognition distance performance may be secured without a need to adjust a setting value in the first state (e.g., a closed state) and the second state (e.g., an open state) of the electronic device 500. In addition, the light source 541 may be disposed in the internal space 501, and the light receiver 542 may be disposed on the rear surface of the flexible display 530, so that light may be irradiated or received only through the flexible display 530. Thus, a partition wall structure to block light from being irradiated directly to the light receiver 542 by the light source 541 may not be required, and a wider FoV may be secured.

Figures 7A, 7B:
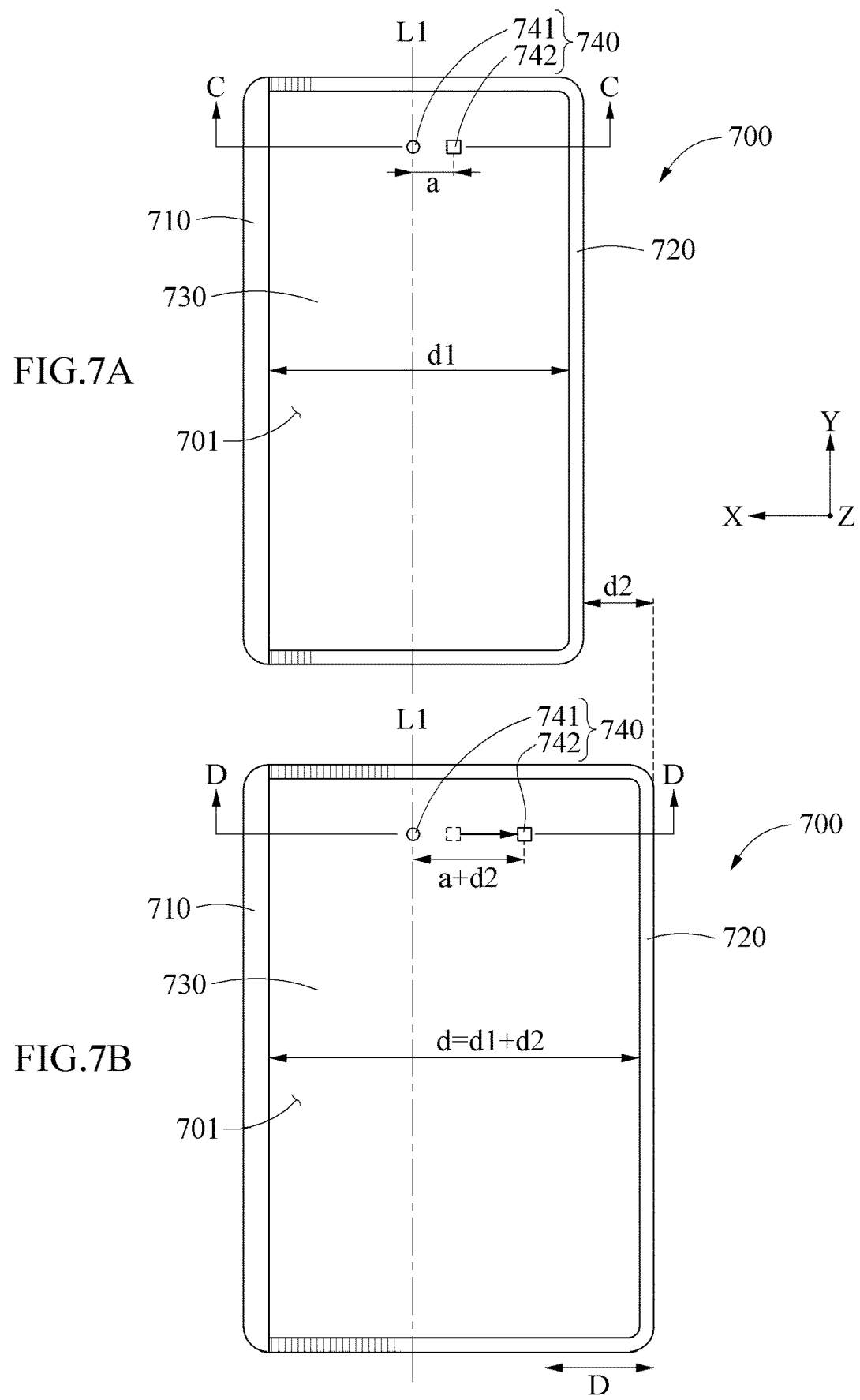
FIG. 7A is a diagram illustrating a front surface of an electronic device in a first state according to various example embodiments.
FIG. 7B is a diagram illustrating the front surface of the electronic device in a second state according to various example embodiments.
Figure 8A:
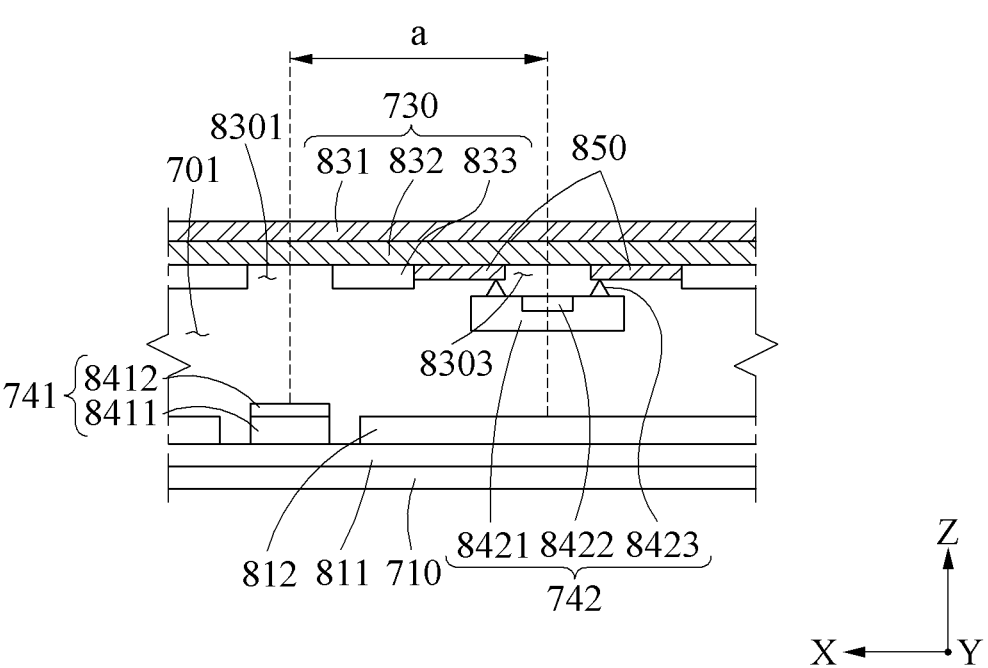
FIG. 8A is a cross-sectional view of the electronic device taken along line C-C of FIG. 7A.
Figure 8B:
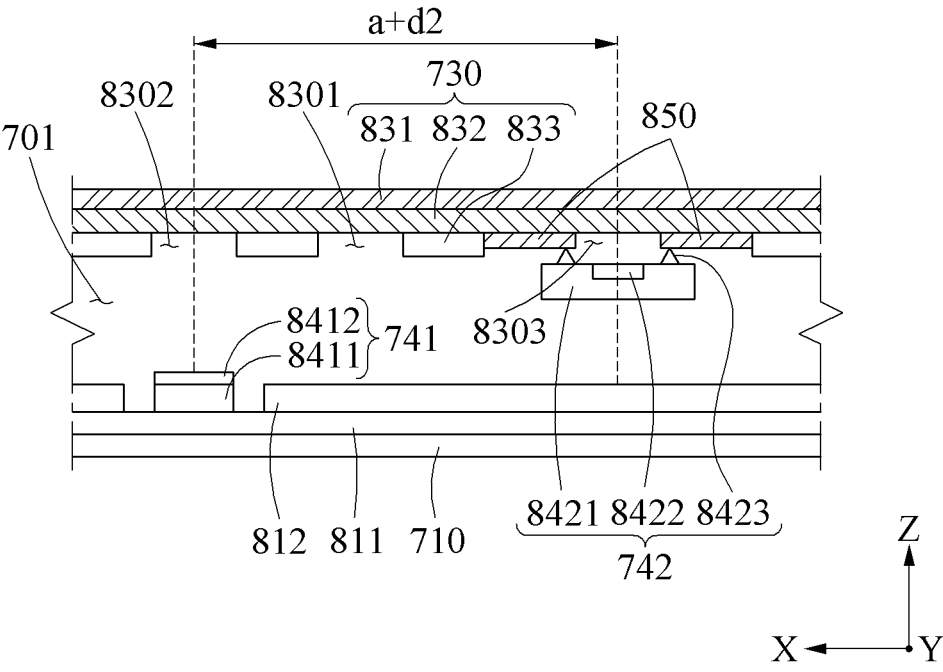
FIG. 8B is a cross-sectional view of the electronic device taken along line D-D of FIG. 7B.

FIG. 7A is a diagram illustrating a front surface of an electronic device in a first state according to various example embodiments, and FIG. 7B is a diagram illustrating the front surface of the electronic device in a second state according to various example embodiments. FIG. 8A is a cross-sectional view of the electronic device taken along line C-C of FIG. 7A, and FIG. 8B is a cross-sectional view of the electronic device taken along line D-D of FIG. 7B.

Referring to FIGS. 7A, 7B, 8A, and 8B, an electronic device 700 (e.g., the electronic device 101 of FIG. 1 or the electronic device 200 of FIG. 2A) according to an example embodiment may include a first housing 710 (e.g., the first housing 210 of FIG. 2A), a second housing 720 (e.g., the second housing 220 of FIG. 2A), a flexible display 730 (e.g., the flexible display 230 of FIG. 2A), an optical sensor 740 (e.g., the sensor module 204 of FIG. 2A), and a processor (e.g., the processor 120 of FIG. 1).

In an example embodiment, the first housing 710 and the second housing 720 may be connected to be relatively movable in a movement direction D (e.g., −X-axis direction of FIG. 7A). According to a relative movement of the second housing 720 with respect to the first housing 710, an operating state of the electronic device 700 may be changed between the first state of FIG. 7A and the second state of FIG. 7B.

The flexible display 730 may be exposed to the outside through a display area. In an example embodiment, the display area of the flexible display 730 may have a minimum area in the first state of FIG. 7A and have a maximum area in the second state of FIG. 7B. The size of the display area of the flexible display 730 may vary depending on the first state and the second state according to the movement direction D.

A PCB 811 may be disposed in an internal space 701 at least formed by the first housing 710 and the second housing 720. An arrangement position of the PCB 811 may be fixed to the electronic device 700 through a front 812.

A display PCB 850 may be electrically connected to the flexible display 730. The display PCB 850 may be connected to a rear surface of the display area of the flexible display 730. In a process in which the size of the display area changes, a relative position between the display PCB 850 and the first housing 710 or the second housing 720 may change.

The optical sensor 740 may include a light source 741 and a light receiver 742. In an example embodiment, the light source 741 may be placed on the PCB 811 through an interposer package 8411. Here, the front 812 may not be required in a portion of the PCB 811 on which the light source 741 is placed. In an example embodiment, the light receiver 742 may be placed on the display PCB 850 such that a FoV of a photodiode 8422 may face a rear surface of the flexible display 730. The light receiver 742 may be connected to the display PCB 850 via a connection member 8423, and a light receiving package 8421 may cover at least a portion of the photodiode 8422 to block light from being irradiated directly to the photodiode 8422 in the internal space 701.

In an example embodiment, a distance between the light source 741 and the light receiver 742 may change to increase a gap therebetween as the size of the display area increases, when the display area is viewed as shown in FIGS. 7A and 7B. Here, a first sensor hole 8301 may be located in an area of the flexible display 730 corresponding to the light source 741 in the first state, and a second sensor hole 8302 may be located in an area of the flexible display 730 corresponding to the light source 741 in the second state, when the display area is viewed as shown in FIGS. 7A and 7B. In an example embodiment, a third sensor hole 8303 may be located in an area of the flexible display 730 in which the light receiver 742 is located. Although the first sensor hole 8301 and the second sensor hole 8302 are formed in the area of the flexible display 730 corresponding to the light source 741 as shown in FIGS. 8A and 8B for convenience of description, at least one sensor hole may be further formed between the first sensor hole 8301 and the second sensor hole 8302 in the flexible display 730 when the display area is viewed. In this example, the sensor hole formed between the first sensor hole 8301 and the second sensor hole 8302 may perform a function of transmitting light from the light source 741 to the outside when the electronic device 700 is in an intermediate state between the first state and the second state.

In an example embodiment, a distance between the light source 741 and the light receiver 742 may increase when the display area is expanded in response to a change in the operating state of the electronic device 700 from the first state to the second state, when the display area is viewed. For example, a distance between the light receiver 742 and a reference line L1 that is perpendicular to the movement direction D and on which the light source 741 is located may increase when the display area is expanded. In this example, the distance between the light receiver 742 and the reference line L1 may increase in proportion to a change in the size of the display area, when the display area is viewed. For example, in the first state, the light receiver 742 may be disposed at a position spaced apart by a distance "a" from the reference line L1 on which the light source 741 is located. If a width of the display area parallel to the movement direction D is increased by d2 in a state in which the display area is expanded in response to the change in the operating state of the electronic device 700 from the first state to the second state, the light receiver 742 may be disposed at a position spaced apart by a+d2 from the reference line L1. In other words, it may be understood that a distance of the light receiver 742 from the reference line L1 may increase in proportion to an increase in the size of the display area, regardless of a distance between the light source 741 and the light receiver 742 in the first state.

In an example embodiment, the processor may control an operation of the optical sensor 740 in response to the distance between the light source 741 and the light receiver 742. For example, the processor may adjust a value of a current applied to the light source 741 based on the distance between the light source 741 and the light receiver 742. For example, the processor may set a variation in the current applied to the light source 741 to be proportional to the change in the size of the display area. In this example, the processor may adjust a setting value of an exposure time (or an integration time) based on a light reception time according to a change in the distance between the light source 741 and the light receiver 742. For example, the processor may set the exposure time to change in proportion to the distance between the light source 741 and the light receiver 742.

Based on the above structure, since the distance between the light source 741 and the light receiver 742 changes in proportion to the change in the size of the display area, predetermined optical performance may be secured regardless of a change in the state of the electronic device 700 through simple setting value adjustment. In addition, a setting value of the optical sensor 740 may be adjusted in proportion to the change in the size of the display area, and accordingly uniform recognition distance performance may be secured even in a process in which the state of the electronic device 700 is variously changed between the first state and the second state.

Figures 9A, 9B:
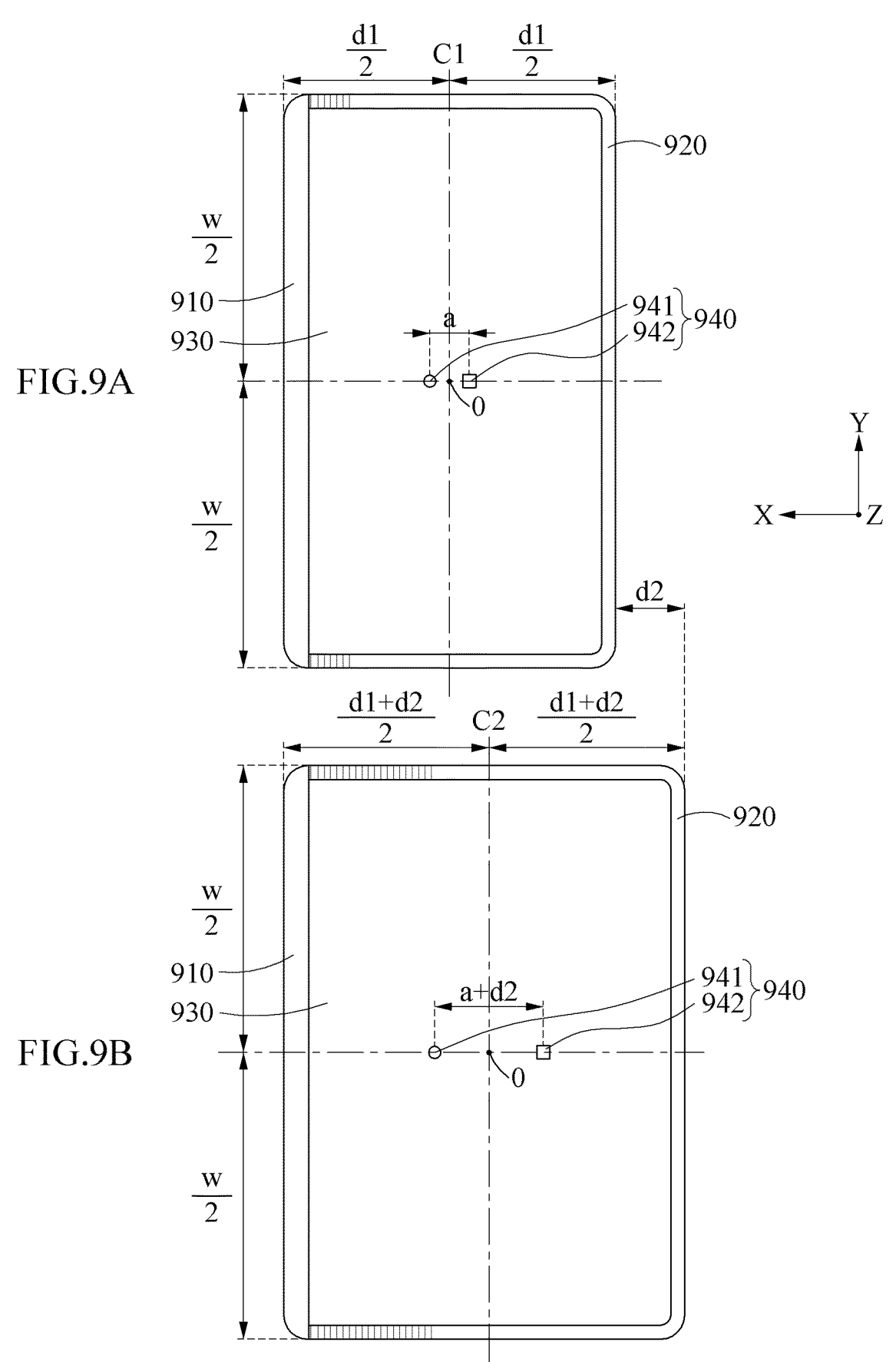
FIG. 9A is a diagram illustrating a front surface of an electronic device in a first state according to various example embodiments.
FIG. 9B is a diagram illustrating the front surface of the electronic device in a second state according to various example embodiments.

FIG. 9A is a diagram illustrating a front surface of an electronic device in a first state according to various example embodiments, and FIG. 9B is a diagram illustrating the front surface of the electronic device in a second state according to various example embodiments.

Referring to FIGS. 9A and 9B, an electronic device (e.g., the electronic device 101 of FIG. 1 or the electronic device

200 of FIG. 2A) according to an example embodiment may include a first housing 910 (e.g., the first housing 210 of FIG. 2A), a second housing 920 (e.g., the second housing 220 of FIG. 2A), a flexible display 930 (e.g., the flexible display 230 of FIG. 2A), and an optical sensor 940 (e.g., the sensor module 204 of FIG. 2A).

The size of the display area of the flexible display 930 may vary depending on the first state and the second state according to a movement direction (e.g., a −X-axis direction of FIG. 9A), in response to a relative movement of the first housing 910 and the second housing 920.

The optical sensor 940 may include a light source 941 and a light receiver 942. In an example embodiment, the light source 941 and the light receiver 942 may be disposed symmetrically, e.g., in a mirror image, with respect to a central line (e.g, a central line C1 of FIG. 9A and a central line C2 of FIG. 9B) that is perpendicular to the movement direction and that bisects the display area, when the display area is viewed. For example, in the first state of FIG. 9A, the light source 941 and the light receiver 942 may be symmetrically disposed at positions that are spaced apart by the same distance, e.g., $$\frac{a}{2},$$

from the central line C1 that is perpendicular to the movement direction by passing through a center O of the display area. In this example, in a state in which the display area is expanded by a width of d2 as shown in FIG. 9B, the light source 941 and the light receiver 942 may be symmetrically disposed at positions that are spaced apart by the same distance, e.g., $$\frac{a+d2}{2},$$

from the central line C2 that is perpendicular to the movement direction by passing through the center O of the display area. In other words, in the first state, when the light source 941 and the light receiver 942 are disposed at positions symmetrical with respect to the central line C1, the light source 941 and the light receiver 942 may be disposed symmetrically with respect to the central lines C1 and C2 passing through the center O of the display area, regardless of a change in the size of the display area.

In an example embodiment, the light source 941 and the light receiver 942 may be disposed on a movement line that is parallel to the movement direction and that passes through the center O of the display area. When the light source 941 and the light receiver 942 remain disposed symmetrically with respect to the central lines C1 and C2, the optical sensor 940 may operate based on the center O of the display area.

Based on the above structure, the optical sensor 940 may operate based on the center O of the display area in view of a user, and thus more accurate recognition performance may be secured when the electronic device is used by the user.

Figures 10A, 10B:
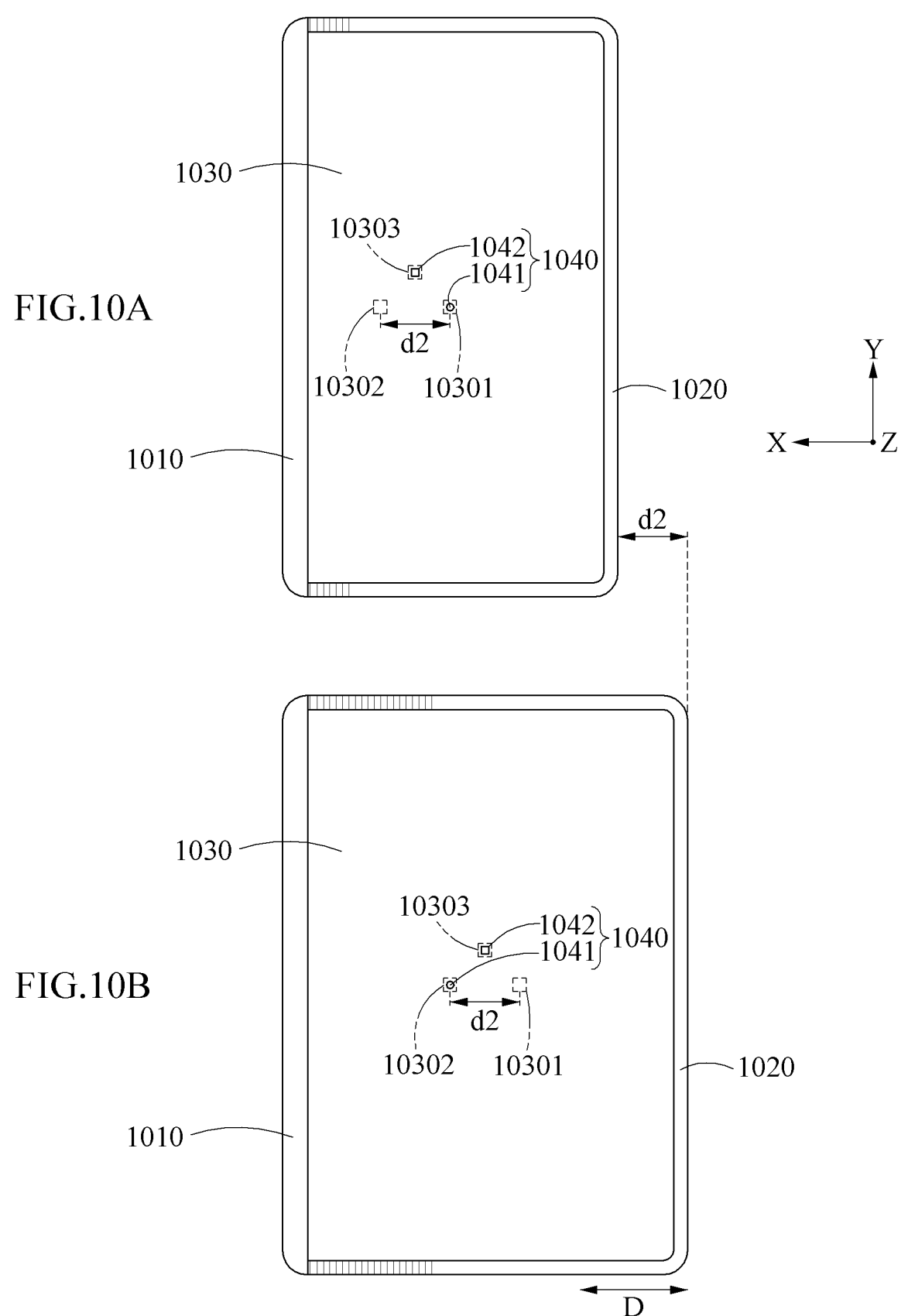
FIG. 10A is a diagram illustrating a front surface of an electronic device in a first state according to various example embodiments.
FIG. 10B is a diagram illustrating the front surface of the electronic device in a second state according to various example embodiments.

FIG. 10A is a diagram illustrating a front surface of an electronic device in a first state according to various example embodiments, and FIG. 10B is a diagram illustrating the front surface of the electronic device in a second state according to various example embodiments.

Referring to FIGS. 10A and 10B, an electronic device (e.g., the electronic device 101 of FIG. 1 or the electronic device 200 of FIG. 2A) according to an example embodiment may include a first housing 1010 (e.g., the first housing 210 of FIG. 2A), a second housing 1020 (e.g., the second housing 220 of FIG. 2A), a flexible display 1030 (e.g., the flexible display 230 of FIG. 2A), and an optical sensor 1040 (e.g., the sensor module 204 of FIG. 2A).

The size of a display area of the flexible display 1030 may change according to a movement direction D in response to a relative movement of the first housing 1010 and the second housing 1020.

In an example embodiment, sensor holes 10301, 10302, and 10303 to transmit light may be formed in the flexible display 1030. The sensor holes 10301, 10302, and 10303 may be formed without being covered by a cover panel (e.g., the cover panel 633 of FIG. 6A) formed of a non-transmissive material. In an example embodiment, the sensor holes 10301, 10302, and 10303 may be formed in areas of the flexible display 1030 corresponding to positions of a light source 1041 and a light receiver 1042 of the optical sensor 1040. For example, the sensor holes 10301, 10302, and 10303 may include a first sensor hole 10301 formed in a first area of the flexible display 1030 overlapping the light source 1041 in the first state, a second sensor hole 10302 formed in a second area of the flexible display 1030 overlapping the light source 1041 in the second state, and a third sensor hole 10303 formed in a third area of the flexible display 1030 overlapping the light receiver 1042, based on a state in which the display area is viewed. In this example, a relative position of the flexible display 1030 with respect to the light source 1041 may change in the first state and the second state, and accordingly the first sensor hole 10301 and the second sensor hole 10302 may be formed based on the relative position of the flexible display 1030 with respect to the light source 1041.

In an example embodiment, in the first state and the second state, when a width of the display area parallel to the movement direction D is increased by d2, the flexible display 1030 may move by d2 in the movement direction D with respect to the first housing 1010, when the display area is viewed. In this example, the first sensor hole 10301 and the second sensor hole 10302 may be disposed along a line parallel to the movement direction D, and may be spaced apart by d2. Accordingly, the first sensor hole 10301 may be disposed at a position overlapping the light source 1041 in the first state, and the second sensor hole 10302 may be disposed at a position overlapping the light source 1041 in the second state, based on the state in which the display area is viewed. Since a relative position of the light receiver 1042 with respect to the flexible display 1030 does not change, the third sensor hole 10303 may be disposed at a position overlapping the light receiver 1042 at all times. Although an arrangement relationship between the light source 1041 and the light receiver 1042 that do not overlap in a process in which a state of the electronic device changes based on the state in which the display area is viewed is illustrated in FIGS. 10A and 10B, example embodiments are not limited thereto. For example, the light source 1041 may be disposed at a position overlapping a movement path of the light receiver 1042. In this example, the third sensor hole 10303 may be formed to be located between the first sensor hole 10301 and the second sensor hole 10302.

Figures 11A, 11B:
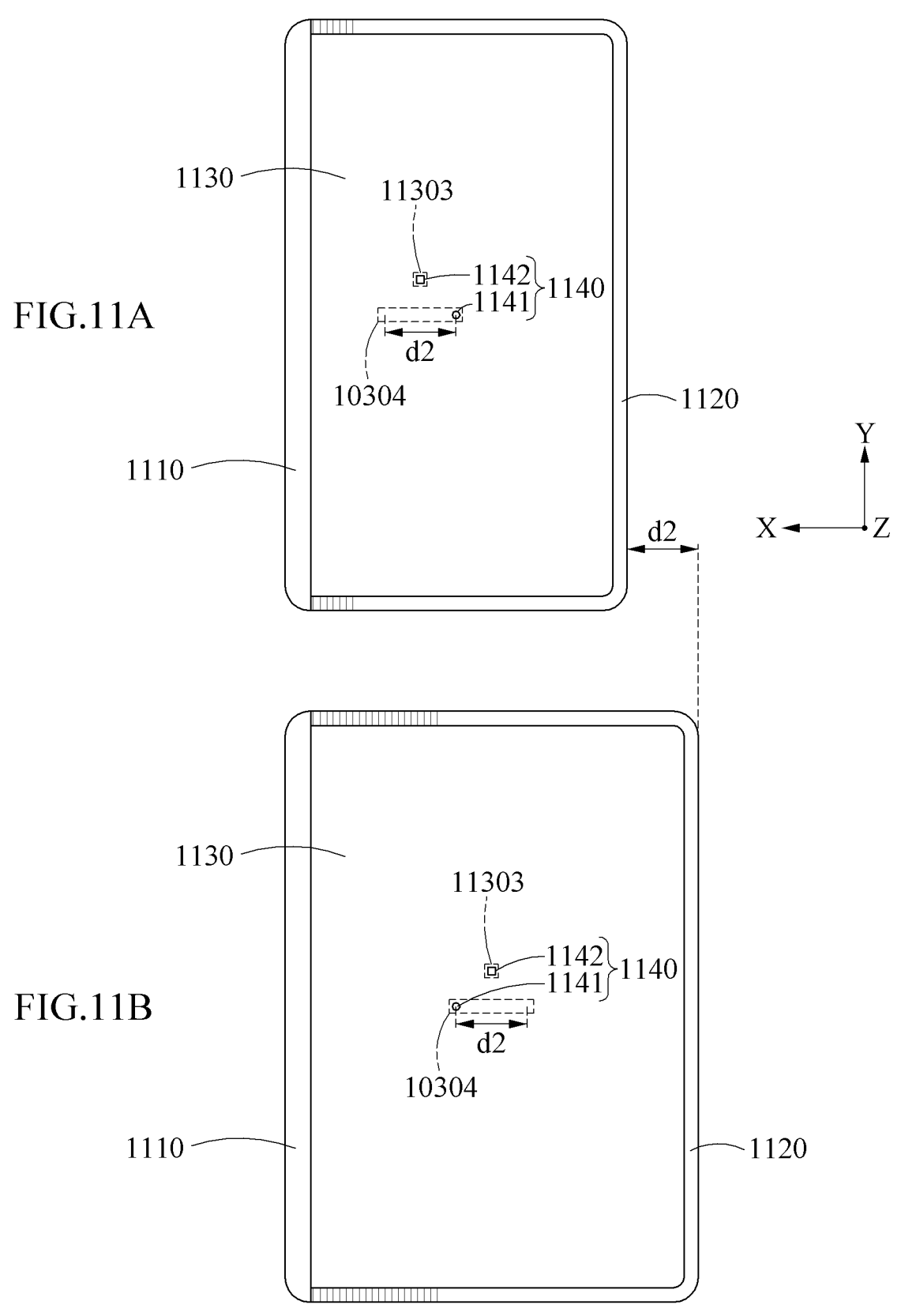
FIG. 11A is a diagram illustrating a front surface of an electronic device in a first state according to various example embodiments.
FIG. 11B is a diagram illustrat-

FIG. 11A is a diagram illustrating a front surface of an electronic device in a first state according to various example embodiments, and FIG. 11B is a diagram illustrating the front surface of the electronic device in a second state according to various example embodiments.

Referring to FIGS. 11A and 11B, an electronic device (e.g., the electronic device 101 of FIG. 1 or the electronic device 200 of FIG. 2A) according to an example embodiment may include a first housing 1110 (e.g., the first housing 210 of FIG. 2A), a second housing 1120 (e.g., the second housing 220 of FIG. 2A), a flexible display 1130 (e.g., the flexible display 230 of FIG. 2A), and an optical sensor 1140 (e.g., the sensor module 204 of FIG. 2A).

The size of a display area of the flexible display 1130 may change according to a movement direction (e.g., a −X-axis direction of FIG. 11A) in response to a relative movement of the first housing 1110 and the second housing 1120.

In an example embodiment, a sensor slot 10304 and a sensor hole 10303 to transmit light may be formed in the flexible display 1130. In an example embodiment, the sensor slot 10304 may be integrally formed along an overlapping area between the flexible display 1130 and a light source 1141 in a process in which a state of the electronic device is changed from the first state to the second state, i.e., when transitioning from the first state to the second state, when the display area is viewed. In the first state and the second state, when a width of the display area parallel to the movement direction is increased by d2, the sensor slot 10304 may be formed to have a width of d2. In this example, since the sensor slot 10304 overlaps the light source 1141 at all times regardless of a state of the display area, light may be emitted from the light source 1141 to the outside through the sensor slot 10304 in all states between the second state of FIG. 11A and the second state of FIG. 11B. In addition, a sensor hole 11303 to transmit light may be separately formed in an area of the flexible display 1130 corresponding to a light receiver 1142. However, unlike the example of FIGS. 11A and 11B, the light receiver 1142 may be disposed on the overlapping area between the flexible display 1130 and the light source 1141. In addition, the light receiver 1142 may receive light reflected from the outside through the sensor slot 10304.

FIG. 12 is a block diagram of an electronic device according to various example embodiments.

An electronic device 1200 (e.g., the electronic device 101 of FIG. 1, the electronic device 200 of FIG. 2A, the electronic device 400 of FIG. 4A, the electronic device 500 of FIG. 5A, or the electronic device 700 of FIG. 7A) may include a processor 12120 (e.g., the processor 120 of FIG. 1), a display 1230 (e.g., the flexible display 430 of FIG. 4A), and an optical sensor 1240 (e.g., the optical sensor 440 of FIG. 4A). In an example embodiment, the optical sensor 1240 may be electrically connected to the processor 12120. Here, a sensing value of the optical sensor 1240 may be transmitted to the processor 12120, and the processor 12120 may control an operation of the electronic device 1200 based on the sensing value of the optical sensor 1240. For example, light may be emitted from a light source 1241 to the outside through a sensor hole (e.g., the first sensor hole 6301 of FIG. 6A). Light scattered or reflected from an external target may be introduced into a light receiver 1242 through a sensor hole (e.g., the third sensor hole 6303 of FIG. 6A). The light receiver 1242 may generate an electrical signal (or a digital value) that is based on the received light, and may transmit the electrical signal to the processor 12120. The electronic device 1200 may include an analog-to-digital converter (ADC) that is electrically connected to the light receiver 1242. The ADC may generate a detection value (or a digital value or an ADC value) corresponding to an amount of light received by the light receiver 1242. The processor 12120 may control the operation of the electronic device 1200 based on the received electrical signal (or a digital value). In an example embodiment, the processor 12120 may adjust the setting value of the optical sensor 1240 based on an operating state of the electronic device 1200. For example, the processor 12120 may adjust a current applied to the light source 1241 or an exposure time during which the light receiver 1242 recognizes reflected light, according to the operating state of the electronic device 1200.

Table 1 shows an example in which the processor 12120 adjusts the setting value of the optical sensor 1240 according to a distance between the light source 1241 and the light receiver 1242 in an example embodiment.

TABLE 1

| Distance (mm) between light source and light receiver | Value (mA) of current applied | Exposure time (μs) |
| --- | --- | --- |
| 5 | 4 | 64 |
| 10 | 6 | 128 |
| 15 | 8 | 256 |
| 20 | 10 | 512 |

As shown in Table 1, if the distance between the light source 1241 and the light receiver 1242 increases, the processor 12120 may increase a value of a current applied to the light source 1241 and the exposure time of the light receiver 1242 to maintain constant recognition distance performance of the optical sensor 1240. In this example, the value of the current applied to the light source 1241 may increase in proportion to an increase in a distance between the light source 1241 and the light receiver 1242. For example, when the distance between the light source 1241 and the light receiver 1242 increases by 5 mm from 5 mm to 10 mm, the current applied to the light source 1241 may increase by 2 mA from 4 mA to 6 mA. When the distance between the light source 1241 and the light receiver 1242 increases by 10 mm from 5 mm to 15 mm, the current applied to the light source 1241 may increase by 4 mA from 4 mA to 8 mA. In other words, the processor 12120 may adjust a variation in the current applied to the light source 1241 to be proportional to a variation in the distance between the light source 1241 and the light receiver 1242. Since an intensity of light generated by the light source 1241 increases as the value of the current applied to the light source 1241 increases, the processor 12120 may adjust the variation in the current applied to the light source 1241 in proportion to the variation in the distance between the light source 1241 and the light receiver 1242, to adjust the intensity of the light generated by the light source 1241 so that the constant recognition distance performance of the optical sensor 1240 may be secured.

In addition, an amount of time during which light irradiated from the light source 1241 is reflected from a target and reaches the light receiver 1242 may increase as the distance between the light source 1241 and the light receiver 1242 increases. Accordingly, the processor 12120 may change the exposure time of the light receiver 1242 in proportion to a change in the distance between the 1241 and the light receiver 1242. For example, as shown in Table 1, the processor 12120 may adjust the setting value so that the exposure time of the light receiver 1242 may increase by 64 μs every time the distance between the light source 1241 and the light receiver 1242 increases by 5 mm.

Through the above scheme, the processor 12120 may realize constant recognition distance performance of the optical sensor 1240 regardless of an operating state of the electronic device, by adjusting the setting value according to the change in the distance between the light source 1241 and the light receiver 1242.

However, numerical values described in Table 1 are merely examples to describe adjustment of the setting value of the processor 12120, and values of the current applied to the light source 1241 and numerical values indicating the exposure time of the light receiver 1242 are not limited to those shown in Table 1 in various example embodiments.

In an example embodiment, the processor 12120 may identify the sensing value of the optical sensor 1240. In an example embodiment, the processor 12120 may receive the sensing value through the optical sensor 1240 even in a state in which the display 1230 is activated, for example, in a state in which the display 1230 is in operation. In an example embodiment, the processor 12120 may determine whether a target (e.g., a user or an object) is close to the electronic device 1200, based on the sensing value of the optical sensor 1240. For example, the processor 12120 may determine whether a target is in the vicinity of the electronic device 1200 or whether the target is close to the electronic device 1200, based on the sensing value of the optical sensor 1240.

The processor 12120 may control a driving of the electronic device 1200 based on determined target information. For example, the processor 12120 may control an on/off operation of a display, and/or an on/off operation of an always-on-display (AOD) mode, based on the sensing value of the optical sensor 1240. In an example embodiment, the processor 12120 may determine whether manipulation information (e.g., display touch information) input to the electronic device 1200 indicates a malfunction, based on the sensing value of the optical sensor 1240. For example, the processor 12120 may identify an output value of the optical sensor 1240 and/or whether a receiver (e.g., a microphone hole) is driven. If it is determined that a user is on the phone through the receiver, the processor 12120 may stop an unnecessary operation of the display 1230, thereby reducing power consumption of the electronic device 1200.

In addition, the processor 12120 may identify the output value of the optical sensor 1240. If it is determined that there is no need to recognize the electronic device 1200 outside, for example, if the electronic device 1200 is in a bag or a pocket, the processor 12120 may operate to stop driving of the AOD mode, thereby reducing unnecessary power consumption. In addition, if it is determined that a target approaches the display 1230 by a distance less than a set distance, based on the output value of the optical sensor 1240, the processor 12120 may determine that a touch input to the display 1230 as an incorrect touch caused by a user's skin contact, and may stop an unnecessary operation of the display 1230. The above-described examples are merely some of examples that may be implemented through various example embodiments, and a control operation of the electronic device 1200 using the processor 12120 is not limited to the above-described examples.

According to various example embodiments, an electronic device 400 may include: a first housing 410, a second housing 420 partially and movably connected to the first housing 410, a flexible display 430 that is disposed to be supported by the first housing 410 and the second housing 420, in which a size of a display area exposed to the outside changes according to a movement of the second housing 420 with respect to the first housing 410, and in which a light transmitting portion through which light is transmitted is formed; a PCB disposed in an internal space formed at least by the first housing 410 and the second housing 420; an optical sensor 440 configured to sense a target located outside the electronic device 400, and a processor. The optical sensor 440 may include a light source 441 disposed on the PCB and configured to irradiate light to the outside of the electronic device 400 through the light transmitting portion, and a light receiver 442 connected to a rear surface of the display area of the flexible display 430 and configured to receive light reflected from the target through the light transmitting portion. Relative positions of the light source 441 and the light receiver 442 may change according to a change in the size of the display area.

In various example embodiments, a display area of the flexible display 430 may change based on the movement direction D such that a state may be changed between a first state in which the display area has a minimum area and a second state in which the display area has a maximum area. The light receiver 442 may move relative to the light source 441 according to a change in the size of the display area of the flexible display 430.

In various example embodiments, a position of the light receiver 542 in the first state and a position of the light receiver 542 in the second state may be symmetrical to each other with respect to a reference line L1 that is perpendicular to the movement direction D and on which the light source 541 is located, in a state in which the display area is viewed.

In various example embodiments, a distance between the light receiver 542 and the light source 541 in the first state and a distance between the light receiver 542 and the light source 541 in the second state may be substantially the same, e.g., within 10% difference.

In various example embodiments, a distance between the light receiver 742 and a reference line that is perpendicular to the movement direction D and on which the light source 741 is located may increase in a process of changing the state from the first state to the second state, in a state in which the display area is viewed.

In various example embodiments, the distance between the light receiver 742 and the reference line L1 may change in proportion to a change in the size of the display area.

In various example embodiments, a current applied to the light source 741 may be set to increase in proportion to the change in the size of the display area.

In various example embodiments, the light transmitting portion may include: a first sensor hole 10301 formed in a first area overlapping the light source 1041 in the first state; and a second sensor hole 10302 formed in a second area overlapping the light source 1041 in the second state, based on a state in which the display area is viewed.

In various example embodiments, the light transmitting portion may further include a third sensor hole 10303 formed in a third area in which the light receiver 1042 is disposed.

In various example embodiments, the third sensor hole 10303 may be located between the first sensor hole 10301 and the second sensor hole 10302.

In various example embodiments, the light transmitting portion may include a sensor slot 11304 integrally formed along an overlapping area that overlaps the light source in the process of changing the state from the first state to the second state, based on the state in which the display area is viewed.

In various example embodiments, the light receiver 1142 may be disposed in the overlapping area.

In various example embodiments, the light source 941 and the light receiver 942 may be located on a central line that is perpendicular to the movement direction D and that bisects the display area of the flexible display 930, based on the state in which the display area is viewed.

In various example embodiments, the electronic device 500 may further include a display PCB 650 connected to a rear surface of a flexible display 530 to face an internal space, and the light receiver 542 may be placed on the display PCB 650.

In various example embodiments, in a state in which the flexible display 1230 is activated, the processor 12120 may determine whether a target is close to the flexible display 1230 through light reflected from the target and received by the light receiver 1242, and may perform a designated operation based on a determination result.

According to various example embodiments, an electronic device 700 may include: a first housing 710; a second housing 720 partially movably connected to the first housing 710; a flexible display 730, a state of the flexible display 730 being changed between a first state in which a display area exposed to the outside has a minimum area and a second state in which the display area has a maximum area, according to a movement of the second housing 720 with respect to the first housing 710; a PCB 811 disposed in an internal space formed at least by the first housing 710 and the second housing 720; an optical sensor 740 including a light source 741 that is placed on the PCB 811 and configured to irradiate light to the outside through the flexible display 730 and a light receiver 742 that is connected to a rear surface of the flexible display 730 and configured to receive light reflected from the outside through the flexible display 730; and a processor. The light receiver 742 may move relative to the light source 741 in a movement direction according to a change in a state of the display area, in a state in which the display area is viewed. A distance between the light receiver 742 and a reference line L1 that is perpendicular to the movement direction D and on which the light source 741 is located may change in proportion to a change in the size the display area.

In various example embodiments, a distance between the light source 741 and the light receiver 742 may increase in proportion to the change in the size of the display area in a process of changing the state from the first state to the second state, based on the state in which the display area is viewed.

In various example embodiments, the flexible display 730 may include a cover panel 833 including a non-transmissive material, and a light transmitting portion without a cover panel may be formed to transmit light in each of areas of the flexible display corresponding to the light source and the light receiver 742, in the first state and the second state.

In various example embodiments, a current applied to the light source 741 may change in proportion to the change in the size of the display area.

According to various example embodiments, an electronic device 500 may include: a first housing 510; a second housing 520 partially movably connected to the first housing 510; a flexible display 530, a state of the flexible display 530 being changed between a first state in which a display area exposed to the outside has a minimum area and a second state in which the display area has a maximum area, according to a movement of the second housing 520 with respect to the first housing 510; a PCB disposed in an internal space formed at least by the first housing 510 and the second housing 520; an optical sensor 540 including a light source 541 that is placed on the PCB and configured to irradiate light to the outside through the flexible display 530 and a light receiver 542 that is connected to a rear surface of the flexible display 530 and configured to receive light reflected from the outside through the flexible display 530; and a processor. The light receiver 542 may move relative to the light source 541 in a movement direction according to a change in a state of the display area, in a state in which the display area is viewed. A distance between the light receiver 542 and the light source 541 in the first state and a distance between the light receiver 542 and the light source 541 in the second state may be substantially the same.

What is claimed is:

1. An electronic device comprising:
a first housing;
a second housing connected to the first housing, one of the first housing and the second housing being movable in a movement direction with respect to another of the first housing and the second housing;
a flexible display that is supported by the first housing and the second housing, the flexible display having a light transmitting portion through which light is transmitted and a display area, a size of the display area exposed to an outside changing based on a movement of the second housing with respect to the first housing;
a printed circuit board (PCB) disposed in an internal space formed at least by the first housing and the second housing;
an optical sensor configured to sense a target located outside the electronic device; and
a processor,
wherein the optical sensor comprises:
a light source disposed on the PCB and configured to irradiate light toward outside of the electronic device through the light transmitting portion; and
a light receiver disposed at a rear surface of the display area of the flexible display and configured to receive light reflected from the target, through the light transmitting portion,
wherein relative positions of the light source and the light receiver change based on a change in the size of the display area.

2. The electronic device of claim 1, wherein
the size of the display area changes based on the movement direction such that a state of the flexible display is changed between a first state in which the display area has a minimum size and a second state in which the display area has a maximum size, and
the light receiver moves relative to the light source based on a change in the size of the display area.

3. The electronic device of claim 2, wherein a position of the light receiver in the first state and a position of the light receiver in the second state are symmetrical to each other with respect to a reference line that is perpendicular to the movement direction and on which the light source is disposed.

4. The electronic device of claim 3, wherein a distance between the light receiver and the light source in the first state and a distance between the light receiver and the light source in the second state are substantially the same.

5. The electronic device of claim 2, wherein a distance between the light receiver and a reference line that is perpendicular to the movement direction and on which the light source is located, increases in a process of changing the state from the first state to the second state.

6. The electronic device of claim 5, wherein the distance between the light receiver and the reference line changes in proportion to a change in the size of the display area.

7. The electronic device of claim 4, wherein a variation in a current applied to the light source is set to be in proportion to a change in a distance between the light receiver and the light source.

8. The electronic device of claim 2, wherein the light transmitting portion comprises:
a first sensor hole formed in a first area overlapping the light source in the first state; and
a second sensor hole formed in a second area overlapping the light source in the second state.

9. The electronic device of claim 8, wherein the light transmitting portion further comprises a third sensor hole formed in a third area at which the light receiver is disposed.

10. The electronic device of claim 9, wherein the third sensor hole is located between the first sensor hole and the second sensor hole.

11. The electronic device of claim 2, wherein the light transmitting portion comprises:
a slot integrally formed along an overlapping area that overlaps the light source during a transition from the first state to the second state.

12. The electronic device of claim 11, wherein the light receiver is disposed in the overlapping area.

13. The electronic device of claim 2, wherein the light source and the light receiver are located symmetrically with respect to a central line that is perpendicular to the movement direction and that bisects the display area of the flexible display.

14. The electronic device of claim 1, further comprising:
a display PCB connected to a rear surface of the flexible display to face the internal space,
wherein the light receiver is disposed on the display PCB.

15. The electronic device of claim 1, wherein the processor is configured to determine whether the target is within a distance from the flexible display based on the light reflected from the target and received by the light receiver and perform an operation based on a result of determining whether the target is within the distance from the flexible display.

16. An electronic device comprising:
a first housing;
a second housing movably connected to the first housing;
a flexible display comprising a display area and, based on a movement of the second housing with respect to the first housing, operable to be in a first state or a second state, the display area exposed to an outside having a minimum area in the first state and the display area having a maximum area in the second state;
a printed circuit board (PCB) disposed in an internal space formed by at least the first housing and the second housing;
an optical sensor comprising:
a light source disposed on the PCB and configured to irradiate light to an outside of the electronic device through the flexible display; and
a light receiver disposed at a rear surface of the flexible display and configured to receive reflected light from the outside through the flexible display; and
a processor,
wherein the light receiver moves relative to the light source based on a change in a state of the display area, and
wherein a distance between the light receiver and a reference line that is perpendicular to a movement direction of the light receiver and on which the light source is located changes in proportion to a change in the size of the display area.

17. The electronic device of claim 16, wherein a distance between the light source and the light receiver increases in proportion to the change in the size of the display area in a process of changing from the first state to the second state.

18. The electronic device of claim 16, wherein
the flexible display comprises a cover panel comprising a non-transmissive material, and
the electronic device further comprises a light transmitting portion formed in the flexible display to transmit light in each of areas of the flexible display corresponding to the light source and the light receiver, in the first state and the second state.

19. The electronic device of claim 16, wherein a current applied to the light source changes in proportion to the change in the size of the display area.

20. An electronic device comprising:
a first housing;
a second housing movably connected to the first housing;
a flexible display comprising a display area and, based on a movement of one of the first housing and the second housing with respect to another of the first housing and the second housing, operable to be a first state or a second state, the display area exposed to an outside having a minimum area in the first state and the display area having a maximum area in the second state;

a printed circuit board (PCB) disposed in an internal space formed by at least the first housing and the second housing;
an optical sensor comprising:
a light source disposed on the PCB and configured to irradiate light to an outside of the electronic device through the flexible display; and
a light receiver disposed at a rear surface of the flexible display and configured to receive reflected light from the outside through the flexible display; and
a processor,
wherein the light receiver moves relative to the light source in a movement direction based on a change in a state of the display area, and
wherein a distance between the light receiver and the light source in the first state and a distance between the light receiver and the light source in the second state are substantially the same.

* * * * *